US012159795B2

(12) United States Patent
Menk et al.

(10) Patent No.: US 12,159,795 B2
(45) Date of Patent: Dec. 3, 2024

(54) ENCLOSURE SYSTEM HAVING WALLS COMPRISING SIDEWALLS AND RADIO-FREQUENCY IDENTIFIER HOLDER COUPLED TO REAR WALL

(71) Applicant: Applied Materials, Inc., Santa Clara, CA (US)

(72) Inventors: John C. Menk, Round Rock, TX (US); Rachel Sara Stolzman, Saratoga, CA (US); Douglas R. McAllister, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 255 days.

(21) Appl. No.: 17/685,181

(22) Filed: Mar. 2, 2022

(65) Prior Publication Data

US 2022/0285180 A1 Sep. 8, 2022

Related U.S. Application Data

(60) Provisional application No. 63/158,258, filed on Mar. 8, 2021.

(51) Int. Cl.
*G05B 99/00* (2006.01)
*G06K 19/07* (2006.01)
(Continued)

(52) U.S. Cl.
CPC .... *H01L 21/67196* (2013.01); *G06K 19/0723* (2013.01); *H01L 21/67063* (2013.01); *H01L 21/67703* (2013.01); *H01L 21/67769* (2013.01)

(58) Field of Classification Search
CPC .............................................. G05B 2219/2602
See application file for complete search history.

(56) References Cited

U.S. PATENT DOCUMENTS

| 6,098,809 A | 8/2000 | Okada et al. |
| 6,199,291 B1 | 3/2001 | Ozee |

(Continued)

FOREIGN PATENT DOCUMENTS

| JP | 0995783 A | 4/1997 |
| JP | 10165884 A | 6/1998 |

(Continued)

OTHER PUBLICATIONS

International Seach Report and Written Opinion dated Sep. 1, 2020, on application No. PCT/US2020/033774.

(Continued)

*Primary Examiner* — Suresh Suryawanshi
(74) *Attorney, Agent, or Firm* — Lowenstein Sandler LLP

(57) ABSTRACT

An enclosure system includes walls including sidewalls and a bottom wall. The enclosure system further includes an enclosure lid configured to removably attach to one or more of the sidewalls. The walls and the enclosure lid at least partially enclose an interior volume of the enclosure system. The enclosure system further includes an upper window disposed in the enclosure lid. The upper window is configured for orientation verification of objects disposed in the interior volume. The enclosure system further includes a radio-frequency identification (RFID) holder coupled to a rear wall. The RFID holder is configured to secure an RFID component. The enclosure system further includes shelves disposed in the interior volume. Each of the shelves is configured to support a corresponding object of the objects.

20 Claims, 9 Drawing Sheets

(51) Int. Cl.
*H01L 21/67* (2006.01)
*H01L 21/677* (2006.01)

(56) References Cited

U.S. PATENT DOCUMENTS

| | | | |
|---|---|---|---|
| 6,394,523 B1* | 5/2002 | Yoo | B60P 3/14 |
| | | | 296/24.32 |
| 6,676,759 B1 | 1/2004 | Takagi | |
| 7,792,350 B2 | 9/2010 | Kiley et al. | |
| 8,384,033 B2 | 2/2013 | Burns et al. | |
| 8,397,739 B2 | 3/2013 | Gregor et al. | |
| 8,784,033 B2 | 7/2014 | Kremerman et al. | |
| 9,457,464 B2 | 10/2016 | Kremerman et al. | |
| 9,579,788 B2 | 2/2017 | Rosenberg et al. | |
| 9,881,820 B2 | 1/2018 | Wong et al. | |
| 9,947,517 B1 | 4/2018 | Luere et al. | |
| 10,014,198 B2 | 7/2018 | Richardson | |
| 10,041,868 B2 | 8/2018 | Gottscho | |
| 10,062,589 B2 | 8/2018 | Wong et al. | |
| 10,062,590 B2 | 8/2018 | Wong et al. | |
| 10,062,599 B2 | 8/2018 | Genetti et al. | |
| 10,103,010 B2 | 10/2018 | Luere et al. | |
| 10,124,492 B2 | 11/2018 | Genetti et al. | |
| 10,964,584 B2 | 3/2021 | Volfovski et al. | |
| 2005/0205209 A1 | 9/2005 | Mosden | |
| 2007/0134904 A1 | 6/2007 | Wan et al. | |
| 2010/0194015 A1 | 8/2010 | Vekstein et al. | |
| 2014/0058270 A1 | 2/2014 | Davidsen et al. | |
| 2016/0211165 A1 | 7/2016 | McChesney et al. | |
| 2016/0211166 A1 | 7/2016 | Yan et al. | |
| 2016/0216185 A1 | 7/2016 | Gottscho | |
| 2017/0053819 A1 | 2/2017 | Richardson | |
| 2017/0113355 A1 | 4/2017 | Genetti et al. | |
| 2017/0115657 A1 | 4/2017 | Trussell et al. | |
| 2017/0117170 A1* | 4/2017 | Wong | H01L 21/67303 |
| 2017/0117172 A1 | 4/2017 | Genetti et al. | |
| 2017/0119339 A1 | 5/2017 | Johnson et al. | |
| 2017/0133283 A1 | 5/2017 | Kenworthy | |
| 2017/0213758 A1 | 7/2017 | Rice et al. | |
| 2017/0236688 A1* | 8/2017 | Caron | H01J 37/32532 |
| | | | 156/345.34 |
| 2017/0236741 A1 | 8/2017 | Angelov et al. | |
| 2017/0236743 A1 | 8/2017 | Severson et al. | |
| 2017/0263478 A1 | 9/2017 | McChesney et al. | |
| 2017/0287682 A1 | 10/2017 | Musselman et al. | |
| 2017/0287753 A1 | 10/2017 | Musselman et al. | |
| 2017/0330786 A1 | 11/2017 | Genetti et al. | |
| 2017/0334074 A1 | 11/2017 | Genetti et al. | |
| 2018/0019107 A1 | 1/2018 | Ishizawa | |
| 2018/0019142 A1 | 1/2018 | Wong et al. | |
| 2018/0032062 A1 | 2/2018 | Trussell et al. | |
| 2018/0040492 A1 | 2/2018 | Wong et al. | |
| 2018/0068879 A1 | 3/2018 | Wong et al. | |
| 2018/0090354 A1 | 3/2018 | Sugita et al. | |
| 2018/0158707 A1* | 6/2018 | Hunter | H01L 21/67294 |
| 2018/0166259 A1 | 6/2018 | Ueda | |
| 2018/0218933 A1 | 8/2018 | Luere et al. | |
| 2018/0233328 A1 | 8/2018 | Ueda et al. | |
| 2018/0277416 A1 | 9/2018 | Takahashi et al. | |
| 2018/0301322 A1 | 10/2018 | Sugita et al. | |
| 2018/0315583 A1 | 11/2018 | Luere et al. | |
| 2018/0315640 A1 | 11/2018 | Jeda et al. | |
| 2019/0088531 A1 | 3/2019 | Sarode Vishwanath et al. | |
| 2020/0122320 A1 | 4/2020 | Yoshida et al. | |
| 2020/0373190 A1* | 11/2020 | Lee | H01L 21/67167 |
| 2020/0373194 A1* | 11/2020 | Volfovski | H01L 21/67748 |
| 2021/0057246 A1* | 2/2021 | Bergantz | H01L 21/67356 |
| 2021/0170584 A1* | 6/2021 | Kopec | H01L 21/67 |

FOREIGN PATENT DOCUMENTS

| | | |
|---|---|---|
| JP | 4208303 B2 | 1/2009 |
| JP | 4559317 B2 | 10/2010 |
| JP | 2011100983 A | 5/2011 |
| KR | 101336036 B1 | 12/2013 |
| KR | 20140058270 A | 5/2014 |
| KR | 20160016409 A | 2/2016 |
| WO | 2004079818 A1 | 9/2004 |
| WO | 2015130690 A1 | 9/2015 |

OTHER PUBLICATIONS

Entegris F300 AutoPds, Wafer Carrier Clean, Secure wafer transport and optimum automation intergartion, https://www.entergris.com.

Entegris Spectra Foup, Front opening unified pod platform with superior microenvironment control, https://www.entegris.com/content/dam/shared-product-assets/wafer-processing/datasheet-spectra-foup-2413.pdf, Retrieved May 20, 2019.

International Seach Report and Written Opinion dated Sep. 4, 2020, on application No. PCT/US2020/033755.

International Search Report and Written Opinion for International Application No. PCT/US2022/019192, mailed Jun. 17, 2022, 10 Pages.

* cited by examiner

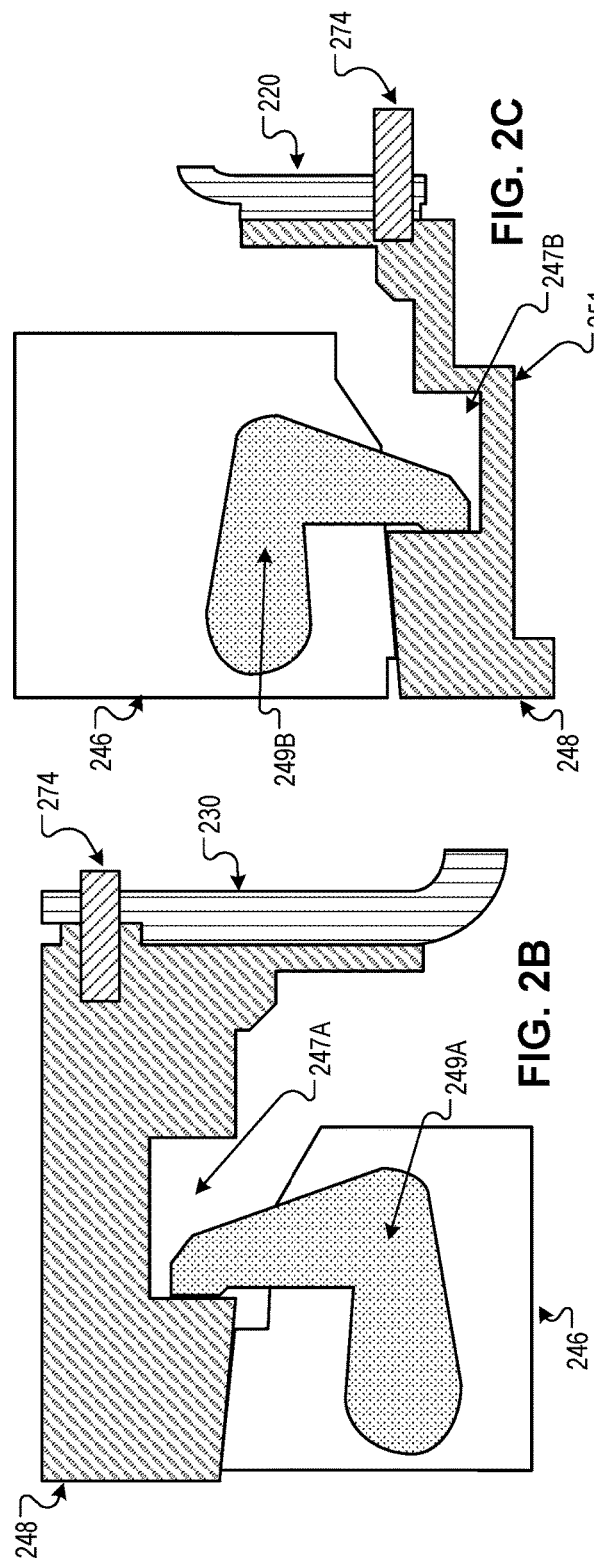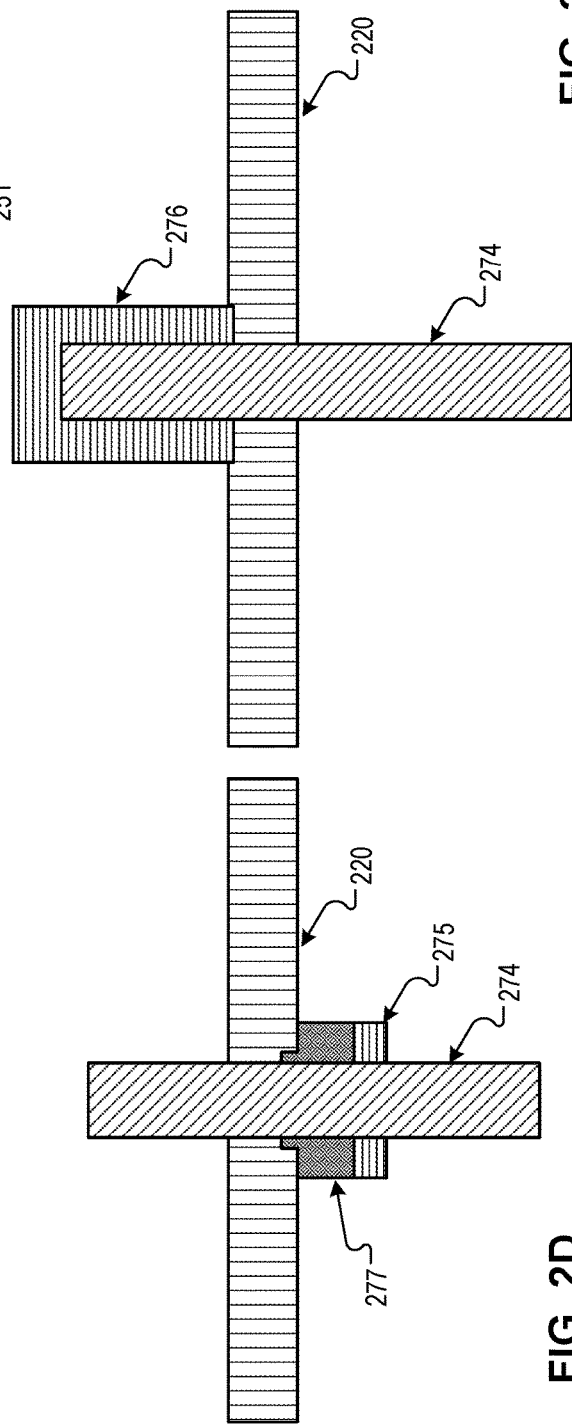

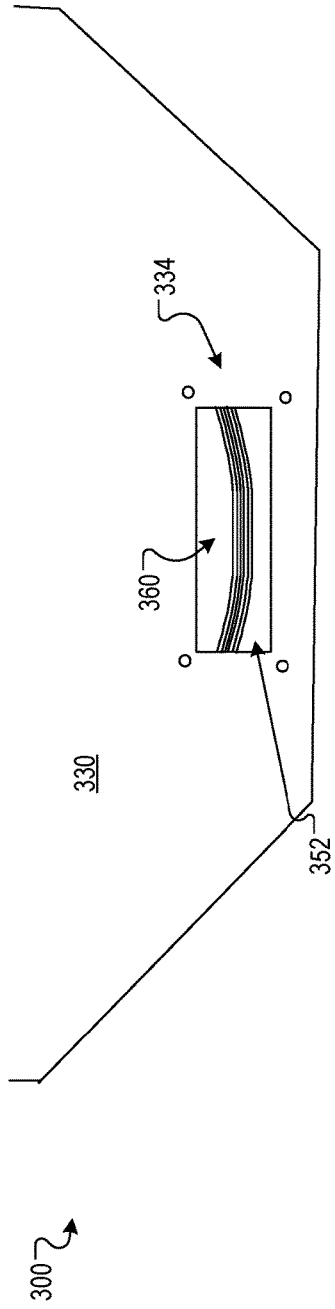
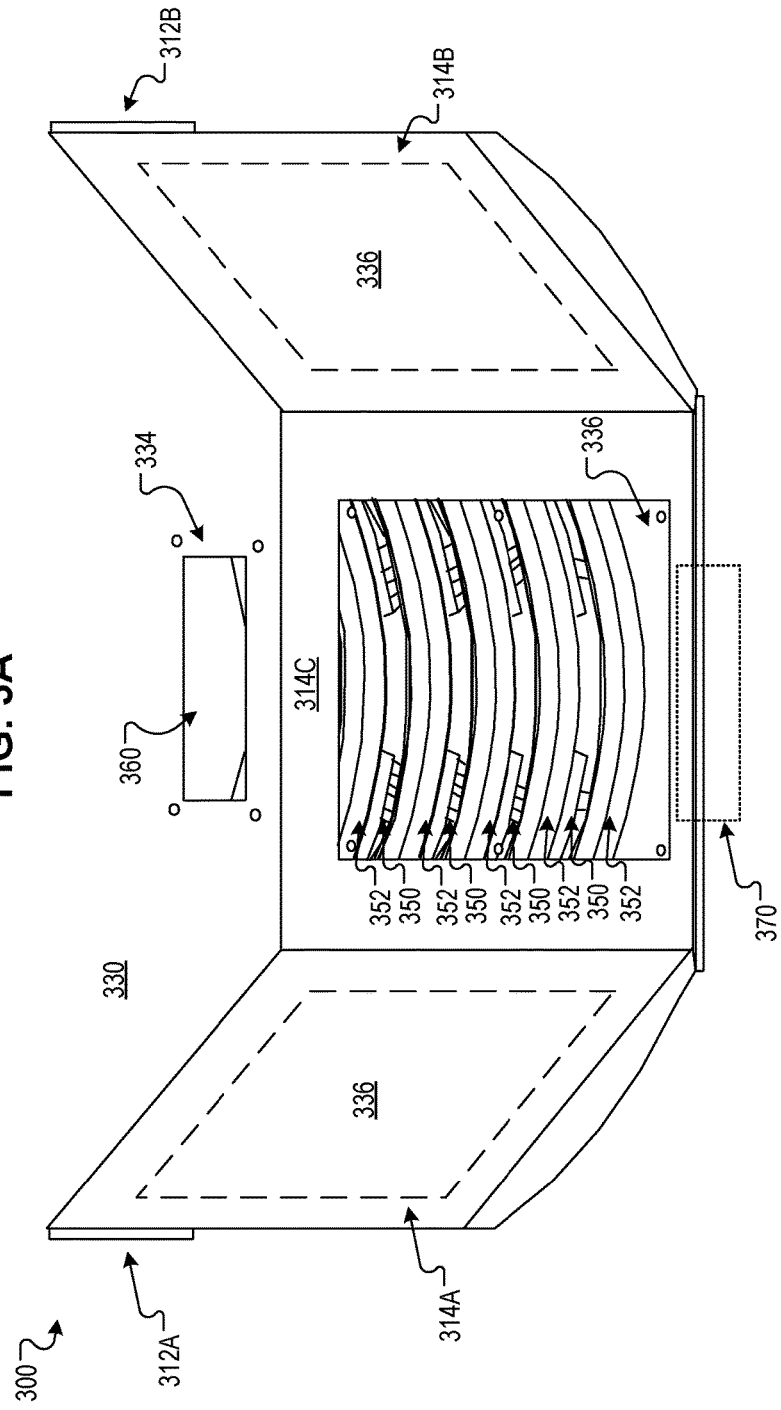

ENCLOSURE SYSTEM HAVING WALLS COMPRISING SIDEWALLS AND RADIO-FREQUENCY IDENTIFIER HOLDER COUPLED TO REAR WALL

RELATED APPLICATION

This application claims the benefit of U.S. Provisional Application No. 63/158,258, filed Mar. 8, 2021, the content of which is hereby incorporated by reference in its entirety.

TECHNICAL FIELD

Embodiments of the present disclosure relate to structures, such as those used in association with substrate processing systems, and in particular to enclosure system structures configured to support process kit rings and/or carriers for process kit rings.

BACKGROUND

In substrate processing and other electronics processing, platforms are often used that use robotic arms to transport objects, such as substrates, between processing chambers, from storage areas (e.g., front opening unified pods (FOUPs)) to processing chambers, from processing chambers to storage areas, and so on. A processing system, such as a substrate processing system, has one or more processing chambers for processing of substrates. A gas is used to etch a substrate in a processing chamber (e.g., a substrate is etched while electrostatically clamped in position in an etch chamber). The robotic arms are to pick up objects from specific locations and transport the objects to specific other locations.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, an enclosure system includes walls including sidewalls and a bottom wall. The enclosure system further includes an enclosure lid configured to removably attach to one or more of the sidewalls. The walls and the enclosure lid at least partially enclose an interior volume of the enclosure system. The enclosure system further includes an upper window disposed in the enclosure lid. The upper window is configured for orientation verification of objects disposed in the interior volume. The enclosure system further includes a radio-frequency identification (RFID) holder coupled to a rear wall. The RFID holder is configured to secure an RFID component. The enclosure system further includes shelves disposed in the interior volume. Each of the shelves is configured to support a corresponding object of the objects.

In another aspect of the disclosure, an enclosure system includes walls including sidewalls and a bottom wall. The enclosure system further includes an enclosure lid configured to removably attach to one or more of the sidewalls. The walls and the enclosure lid at least partially enclose an interior volume of the enclosure system. The enclosure system further includes posts disposed in the interior volume of the enclosure system. The posts are secured to the bottom wall of the enclosure system. A corresponding upper surface of each the posts is configured to removably interface with a corresponding component of the enclosure lid. The enclosure system further includes shelves. Each of the shelves is configured to support a corresponding object. Each of the shelves is secured to at least one corresponding post of the posts.

In another aspect of the disclosure, a method includes removably attaching an enclosure lid to one or more walls of an enclosure system. The method further includes loading objects on shelves disposed in an interior volume formed by the enclosure system. An upper window disposed in the enclosure lid is configured for orientation verification of the objects. The method further includes inserting an RFID component into an RFID holder coupled to a rear wall.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 2B-C illustrate cross sectional side views of components of enclosure systems associated with securing a door, according to certain embodiments.

FIGS. 2D-E illustrate cross sectional side views of components of enclosure systems associated with fastening, according to certain embodiments.

FIG. 3A illustrates a top view of an enclosure system, according to certain embodiments.

FIG. 3B illustrates a rear perspective view of an enclosure system, according to certain embodiments.

DETAILED DESCRIPTION OF EMBODIMENTS

Figure 1:
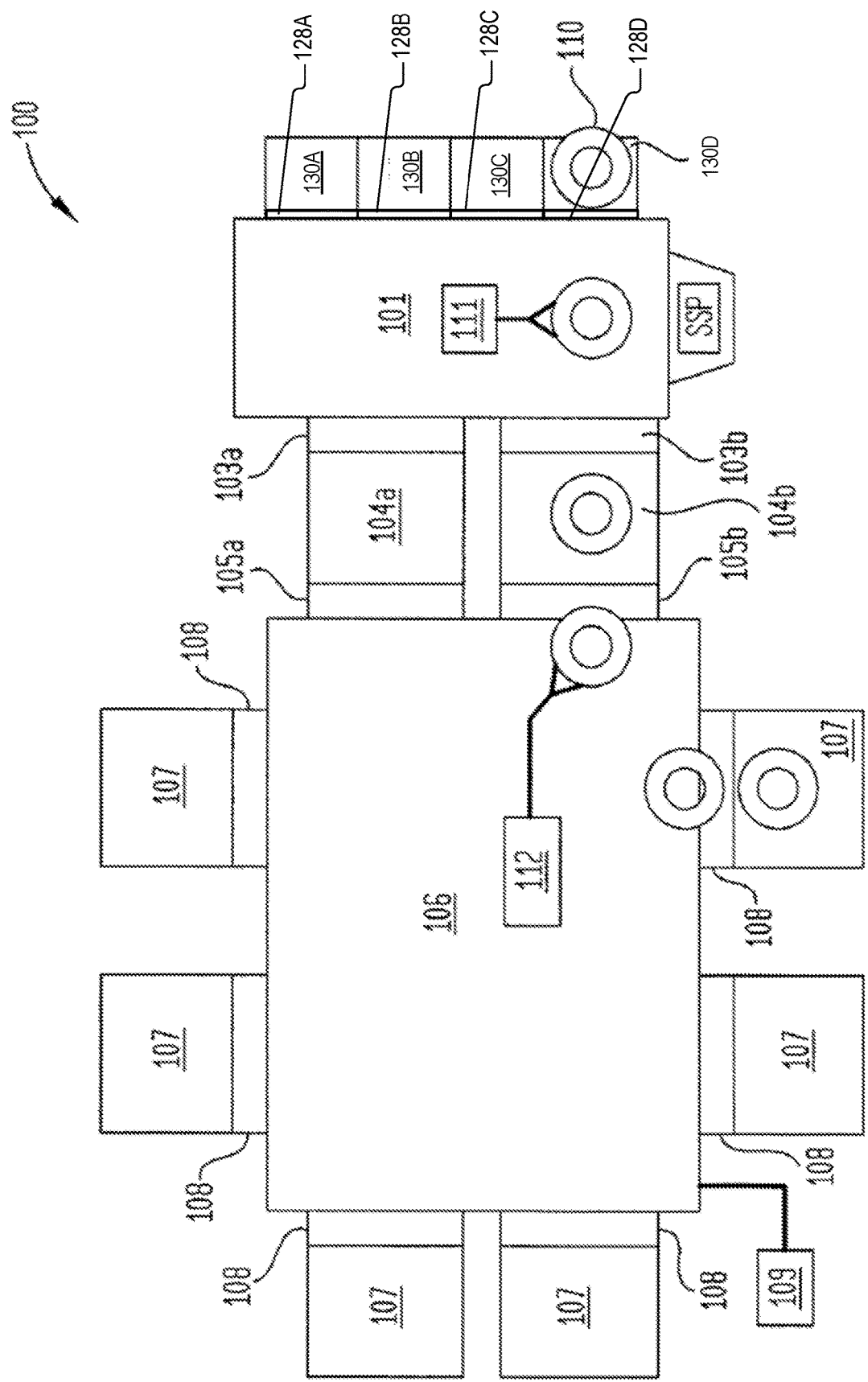
FIG. 1 illustrates a processing system, according to certain embodiments.

Embodiments described herein are related to an enclosure system structure.

Substrate processing systems are used to process substrates. The substrate processing system includes a factory interface, load lock, transfer chamber, and processing chambers. A substrate storage system (e.g., FOUP) is coupled (e.g., docked via a load port) to the factory interface, a factory interface robot transports substrates from the substrate storage system (through the factory interface) to the load lock, a transfer chamber robot transports substrates from the load lock (through the transfer chamber) to the processing chambers to be processed, the processed substrate is transported by the transfer chamber robot to the loadlock and by the factory interface robot from the load lock to the substrate storage system. The factory interface maintains a first environment (e.g., atmospheric environment, inert environment, etc.) and the transfer chamber maintains a second environment (e.g., vacuum environment) to avoid contaminating the substrates and the substrate processing system.

Components of the substrate processing system become worn over time and are to be removed and replaced. For example, process kit rings are disposed in the processing chambers and become worn over time due to substrate processing operations and are to be replaced. Opening of the substrate processing system (e.g., transfer chamber, processing chamber, etc.) to remove and replace components (e.g., process kit rings) causes the substrate processing chamber to become contaminated and results in a re-commissioning processes that keep the substrate processing system off-line which decreases yield, uses energy, and uses operator time.

Substrate storage systems of unprocessed substrates are transported to and coupled (e.g., via a load lock) to the factory interface and substrate storage systems of processed substrates are uncoupled from the factory interface (e.g., substrate storage system is undocked from load port) and transported from the factory interface. During loading, transportation, and handling, objects disposed in the substrate storage system may be loaded incorrectly, be incorrectly oriented, and/or the like which may result in decreased yield, defective substrates, opening of the substrate processing system, re-commissioning processes, increased energy usage, and increased operator time.

The devices, systems, and method of the present disclosure provide an enclosure system structure. The enclosure system is configured to be used to store and transport objects, such as carriers, processing kit rings, substrates, validation wafers (e.g., placement validation wafers), and/or the like. Each carrier may support one or more process kit rings.

The enclosure system may have walls including sidewalls and a bottom wall. The enclosure system may include an enclosure lid that removably attaches to one or more of the sidewalls. The walls and lid at least partially enclose an interior volume of the enclosure system. In some embodiments, an enclosure door of the enclosure system removably attaches to one or more of the sidewalls. The enclosure door, walls, and enclosure lid provide a sealed environment in the interior volume of the enclosure system. Shelves are disposed in the interior volume to support objects (e.g., carriers, validation wafers, etc.) in the enclosure system.

In some embodiments, an upper window is disposed in the enclosure lid. The upper window is configured for orientation verification of the objects disposed in the interior volume of the enclosure system. In some embodiments, a rear window is disposed in a rear wall of the sidewalls. The rear window is removable for orientation adjustment of the objects. In some examples, orientation verification is performed through the upper window (e.g., via automation or manually), an object that is not correctly oriented is identified, and the rear window is removed to adjust orientation of the object (e.g., via automation or manually).

In some embodiments, posts are disposed in the interior volume of the enclosure system. The posts are secured to the bottom wall of the enclosure system. An upper surface of each of the posts is configured to removably interface with a corresponding component of the enclosure lid.

In some embodiments, the enclosure system includes a radio-frequency identification (RFID) holder disposed proximate the rear wall of the enclosure system. The RFID holder may hold an RFID component (e.g., RFID pill). In some embodiments, the RFID holder is configured to hold the RFID component in either a horizontal orientation or a vertical orientation. The RFID component may electronically store information about the enclosure system, such as an inventory of the enclosure system and/or a type of the enclosure system, to be read by an RFID reader.

In some embodiments, the shelves include a first shelf configured to support a first distal end of a carrier and a second shelf configured to support a second distal end of the carrier. The first shelf forms a first recess and the second shelf forms a second recess. One or more process kit rings disposed on the carrier supported by the first shelf and the second shelf are disposed in the first recess and the second recess without contacting the first shelf and without contacting the second shelf. The first recess and the second recess are configured to maintain the one or more process kit rings on the carrier during movement of the enclosure system (e.g., during jostling, rapid movement, etc.). In some embodiments, the first shelf forms a first alignment feature and the second shelf forms a second alignment feature. The first and second alignment features may be configured to align a placement validation wafer on the first and second shelves. In some embodiments, the first and second alignment features do not interfere with a process kit ring on a carrier when the first and second shelf support a carrier.

The devices, systems, and methods disclosed herein have advantages over conventional solutions. The enclosure system provides for replacing components (e.g., process kit rings) of the substrate processing system without opening the sealed environments (e.g., without opening the transfer chamber, without opening the processing chamber) and without time and energy intensive re-commissioning processes of conventional systems. The enclosure system provides for orientation verification and orientation adjustment of objects disposed in the enclosure system which reduces defective substrates, increases yield, etc. compared to conventional systems. The enclosure system provides for re-orienting of objects disposed in the enclosure system during movement of the enclosure system (e.g., jostling, rapid movement, etc.) which provides less errors in orientation of objects compared to conventional systems. The enclosure system provides for the storage of electronic information associated with the enclosure system, reducing the need for separate cataloguing of the enclosure system. In some embodiments, the enclosure system provides for the ability to store either placement validation wafers or process kit rings on a carrier on a single set of shelves, reducing the need for distinct shelves to support different objects. The enclosure system provides better sealing when compared to conventional systems, providing less contamination and greater cleanliness when compared to conventional systems.

Although portions of the present description refer to process kit rings and carriers, the present description can be applied to different types of content (e.g., other components of the substrate processing system, etc. Although portions of the present description refer to substrate processing systems, the present description can be applied to other types of systems (e.g., other manufacturing systems, etc.).

FIG. 1 illustrates a processing system 100 (e.g., substrate processing system, substrate processing system, semiconductor processing system) according to certain embodiments. The processing system 100 includes a factory interface 101 and load ports 128 (e.g., load ports 128A-D). In some embodiments, the load ports 128A-D are directly mounted to (e.g., seal against) the factory interface 101. Enclosure systems 130 (e.g., cassette, FOUP, process kit enclosure system, or the like) are configured to removably couple (e.g., dock) to the load ports 128A-D. Referring to FIG. 1, enclosure system 130A is coupled to load port 128A, enclosure system 130B is coupled to load port 128B, enclosure system 130C is coupled to load port 128C, and enclosure system 130D is coupled to load port 128D. In some embodiments, one or more enclosure systems 130 are coupled to the load ports 128 for transferring substrates and/or other substrates into and out of the processing system 100. Each of the enclosure systems 130 seals against a respective load port 128. In some embodiments, a first enclosure system 130A is docked to a load port 128A (e.g., for replacing used process kit rings). Once such operation or operations are performed, the first enclosure system 130A is then undocked from the load port 128A, and then a second enclosure system 130 (e.g., a FOUP containing substrates) is docked to the same load port 128A. In some embodiments, an enclosure system 130 (e.g., enclosure system 130A) is an enclosure system with shelves for aligning carriers and/or process kit rings.

In some embodiments, a load port 128 includes a door interface portion 248 (e.g., front interface) that forms a vertical opening (or a substantially vertical opening). The load port 128 additionally includes a horizontal surface for supporting an enclosure system 130 (e.g., cassette, process kit enclosure system). Each enclosure system 130 (e.g., FOUP of substrates, process kit enclosure system) has a door interface portion 248 (e.g., front interface) that forms a vertical opening. The door interface portion 248 (e.g., front interface) of the enclosure system 130 is sized to interface with (e.g., seal to) the door interface portion 248 (e.g., front interface) of the load port 128 (e.g., the vertical opening of the enclosure system 130 is approximately the same size as the vertical opening of the load port 128). The enclosure system 130 is placed on the horizontal surface of the load port 128 and the vertical opening of the enclosure system 130 aligns with the vertical opening of the load port 128. The door interface portion 248 (e.g., front interface) of the enclosure system 130 interconnects with (e.g., clamp to, be secured to, be sealed to) the door interface portion 248 (e.g., front interface) of the load port 128. A bottom plate (e.g., base plate) of the enclosure system 130 has features (e.g., load features, such as recesses, grooves, or receptacles, that engage with load port kinematic pin features, a load port feature for pin clearance, and/or an enclosure system docking tray latch clamping feature) that engage with the horizontal surface of the load port 128. The same load ports 128 that are used for different types of enclosure systems 130 (e.g., process kit enclosure system, cassettes that contain substrates, etc.).

In some embodiments, enclosure system 130 includes one or more shelves for aligning carriers and/or process kit rings. In some embodiments, enclosure system 130 includes a pair of shelves for aligning a carrier and/or content (e.g., process kit ring, processing chamber component, etc.) disposed on the carrier. In some embodiments, enclosure system 130 includes two pairs of shelves, three pairs of shelves, four pairs of shelves, five pairs of shelves, six pairs of shelves, seven pairs of shelves, eight pairs of shelves, and/or the like for aligning objects (e.g., carriers, process kit rings, placement validation wafer, etc.). In some embodiments, each shelf of the pair of shelves includes an alignment feature configured to align a placement validation wafer disposed on the pair of shelves. Each alignment feature may be further configured to not interfere with content disposed on a carrier when the carrier is disposed on the pair of shelves.

In some embodiments, the enclosure system 130 (e.g., process kit enclosure system) includes one or more items of content 110 (e.g., one or more of a process kit ring, an empty process kit ring carrier, a process kit ring disposed on a process kit ring carrier, a placement validation wafer, etc.). In some examples, the enclosure system 130 is coupled to the factory interface 101 (e.g., via load port 128) to enable automated transfer of a process kit ring on a process kit ring carrier into the processing system 100 for replacement of a used process kit ring.

In some embodiments, the enclosure system 130 includes an RFID holder configured to hold an RFID component. The RFID component may store electronic information associated with the enclosure system 130 (e.g., an inventory of the enclosure system 130, a type of enclosure system 130, etc.) for reading by an RFID reader (e.g., of a load port 128). In some embodiments, the RFID component transmits the electronic information in an RF cloud (e.g., an electromagnetic field emitted by the RFID component) proximate the enclosure system 130. An RFID reader of a load port 128 may read the electronic information stored on the RFID component responsive to the enclosure system 130 being docked to the load port 128.

In some embodiments, the processing system 100 also includes first vacuum ports 103a, 103b coupling the factory interface 101 to respective degassing chambers 104a, 104b (e.g., load locks). Second vacuum ports 105a, 105b are coupled to respective degassing chambers 104a, 104b and disposed between the degassing chambers 104a, 104b and a transfer chamber 106 to facilitate transfer of substrates and content 110 (e.g., process kit rings) into the transfer chamber 106. In some embodiments, a processing system 100 includes and/or uses one or more degassing chambers 104 and a corresponding number of vacuum ports 103, 105 (e.g., a processing system 100 includes a single degassing chamber 104, a single first vacuum port 103, and a single second vacuum port 105). The transfer chamber 106 includes a plurality of processing chambers 107 (e.g., four processing chambers 107, six processing chambers 107, etc.) disposed therearound and coupled thereto. The processing chambers 107 are coupled to the transfer chamber 106 through respective ports 108, such as slit valves or the like. In some embodiments, the factory interface 101 is at a higher pressure (e.g., atmospheric pressure) and the transfer chamber 106 is at a lower pressure (e.g., vacuum). Each degassing chamber 104 (e.g., load lock, pressure chamber) has a first door (e.g., first vacuum port 103) to seal the degassing chamber 104 from the factory interface 101 and a second door (e.g., second vacuum port 105) to seal the degassing chamber 104 from the transfer chamber 106. Content is to be transferred from the factory interface 101 into a degassing chamber 104 while the first door is open and the second door is closed, the first door is to close, the pressure in the degassing chamber 104 is to be reduced to match the transfer chamber 106, the second door is to open, and the content is to be transferred out of the degassing chamber 104. A local center finding (LCF) device is to be used to align the content in the transfer chamber 106 (e.g., before entering a processing chamber 107, after leaving the processing chamber 107).

In some embodiments, the processing chambers 107 includes one or more of etch chambers, deposition chambers (including atomic layer deposition, chemical vapor deposition, physical vapor deposition, or plasma enhanced versions thereof), anneal chambers, or the like.

Factory interface 101 includes a factory interface robot 111. Factory interface robot 111 includes a robot arm, such as a selective compliance assembly robot arm (SCARA) robot. Examples of a SCARA robot include a 2 link SCARA robot, a 3 link SCARA robot, a 4 link SCARA robot, and so on. The factory interface robot 111 includes an end effector on an end of the robot arm. The end effector is configured to pick up and handle specific objects, such as substrates. Alternatively, or additionally, the end effector is configured to handle objects such as a carrier and/or process kit rings (edge rings). The robot arm has one or more links or members (e.g., wrist member, upper arm member, forearm member, etc.) that are configured to be moved to move the end effector in different orientations and to different locations.

The factory interface robot 111 is configured to transfer objects between enclosure systems 130 (e.g., cassettes, FOUPs) and degassing chambers 104a, 104b (or load ports). While conventional systems are associated with misalignment of content or opening of (e.g., disassembly of, breaking the seal of, contaminating) a processing system 100 (e.g., factory interface 101) to align misaligned content, the processing system 100 is configured to facilitate alignment of content (e.g., via a shelf of an enclosure system 130, via a removable rear window of the enclosure system 130) without opening of (e.g., disassembly of, breaking the seal of, contaminating) the processing system 100 by an operator. Accordingly, in embodiments a sealed environment including an interior volume of an enclosure system 130 and an internal volume of the factory interface 101 are maintained during the alignment of content (e.g., via a shelf of an enclosure system 130, via a removable rear window of the enclosure system 130).

Transfer chamber 106 includes a transfer chamber robot 112. Transfer chamber robot 112 includes a robot arm with an end effector at an end of the robot arm. The end effector is configured to handle particular objects, such as substrates. In some embodiments, the transfer chamber robot 112 is a SCARA robot, but has fewer links and/or fewer degrees of freedom than the factory interface robot 111 in some embodiments.

A controller 109 controls various aspects of the processing system 100. The controller 109 is and/or includes a computing device such as a personal computer, a server computer, a programmable logic controller (PLC), a microcontroller, and so on. The controller 109 includes one or more processing devices, which, in some embodiments, are general-purpose processing devices such as a microprocessor, central processing unit, or the like. More particularly, in some embodiments, the processing device is a complex instruction set computing (CISC) microprocessor, reduced instruction set computing (RISC) microprocessor, very long instruction word (VLIW) microprocessor, or a processor implementing other instruction sets or processors implementing a combination of instruction sets. In some embodiments, the processing device is one or more special-purpose processing devices such as an application specific integrated circuit (ASIC), a field programmable gate array (FPGA), a digital signal processor (DSP), network processor, or the like. In some embodiments, the controller 109 includes a data storage device (e.g., one or more disk drives and/or solid state drives), a main memory, a static memory, a network interface, and/or other components. In some embodiments, the controller 109 executes instructions to perform any one or more of the methods or processes described herein. The instructions are stored on a computer readable storage medium, which include one or more of the main memory, static memory, secondary storage and/or processing device (during execution of the instructions). The controller 109 receives signals from and sends controls to factory interface robot 111 and substrate transfer chamber robot 112 in some embodiments.

FIG. 1 schematically illustrates transfer of content 110 (e.g., a process kit ring disposed on a carrier) into a processing chamber 107. According to one aspect of the disclosure, content 110 is removed from an enclosure system 130 via factory interface robot 111 located in the factory interface 101. The factory interface robot 111 transfers the content 110 through one of the first vacuum ports 103a, 103b and into a respective degassing chamber 104a, 104b. A transfer chamber robot 112 located in the transfer chamber 106 removes the content 110 from one of the degassing chambers 104a, 104b through a second vacuum port 105a or 105b. The transfer chamber robot 112 moves the content 110 into the transfer chamber 106, where the content 110 is transferred to a processing chamber 107 though a respective port 108. While not shown for clarity in FIG. 1, transfer of the content 110 includes transfer of a process kit ring disposed on a carrier, transfer of an empty process kit ring carrier, transfer of a placement validation wafer, transfer of a component of processing system 100 disposed on a carrier, transfer of a substrate disposed on a carrier, transfer of an empty carrier, transfer of a process kit ring without a carrier, etc.

FIG. 1 illustrates one example of transfer of content 110, however, other examples are also contemplated. In some examples, it is contemplated that the enclosure system 130 is coupled to the transfer chamber 106 (e.g., via a load port mounted to the transfer chamber 106). From the transfer chamber 106, the content 110 is to be loaded into a processing chamber 107 by the transfer chamber robot 112. Additionally, in some embodiments, content 110 is loaded in a substrate support pedestal (SSP). In some embodiments, an additional SSP is positioned in communication with the factory interface 101 opposite the illustrated SSP. Processed content 110 (e.g., a used process kit ring) is to be removed from the processing system 100 in reverse of any manner described herein. When utilizing multiple enclosure systems 130 or a combination of enclosure systems 130 and SSP, in some embodiments, one SSP or enclosure system 130 is to be used for unprocessed content 110 (e.g., new process kit rings), while another SSP or enclosure system 130 is to be used for receiving processed content 110 (e.g., used process kit rings). The enclosure system 130 is used to align content 110 (e.g., via a shelf in the enclosure system 130, via a removable rear window of the enclosure system 130, via alignment features of shelves of enclosure system 130) prior to transfer of content 110 via the robot arm and/or prior to transfer of the enclosure system 130. The shelf aligning the content 110 and/or aligning the content 110 via the removable rear window of the enclosure system 130 enable the robot arm to correctly remove content 110 from specific locations in the enclosure system 130, enable the content 110 to be properly secured in the enclosure system 130 (e.g., enable the shelf to secure the content 110), and enable the enclosure system 130 to properly transport content 110.

The processing system 100 includes chambers, such as factory interface 101 (e.g., equipment front end module (EFEM)) and adjacent chambers (e.g., load port 128, enclosure system 130, SSP, degassing chamber 104 such as a loadlock, or the like) that are adjacent to the factory interface 101. One or more of the chambers is sealed (e.g., each of the chambers is sealed). The adjacent chambers are sealed to the factory interface 101. In some embodiments, inert gas (e.g., one or more of nitrogen, argon, neon, helium, krypton, or xenon) is provided into one or more of the chambers (e.g., the factory interface 101 and/or adjacent chambers) to provide one or more inert environments. In some examples, the factory interface 101 is an inert EFEM that maintains the inert environment (e.g., inert EFEM minienvironment) within the factory interface 101 so that users do not need to enter the factory interface 101 (e.g., the processing system 100 is configured for no manual access within the factory interface 101).

In some embodiments, gas flow (e.g., inert gas, nitrogen) is provided into one or more chambers (e.g., factory interface 101, enclosure system 130) of the processing system 100. In some embodiments, the gas flow is greater than leakage through the one or more chambers to maintain a positive pressure within the one or more chambers. In some embodiments, the inert gas within the factory interface 101 is recirculated. In some embodiments, a portion of the inert gas is exhausted. In some embodiments, the gas flow of non-recirculated gas into the factory interface 101 is greater than the exhausted gas flow and the gas leakage to maintain a positive pressure of inert gas within the factory interface 101. In some embodiments, the factory interface 101 is coupled to one or more valves and/or pumps to provide the gas flow into and out of the factory interface 101. A processing device (e.g., of controller 109) controls the gas flow into and out of the factory interface 101 and/or enclosure system 130. In some embodiments, the processing device receives sensor data from one or more sensors (e.g., oxygen sensor, moisture sensor, motion sensor, door actuation sensor, temperature sensor, pressure sensor, etc.) and determines, based on the sensor data, the flow rate of inert gas flowing into and/or out of the factory interface 101 and/or enclosure system 130.

The enclosure system 130 allows for aligning of content 110 (e.g., carrier, process kit ring, placement validation wafer, and/or the like) without opening the sealed environment within the factory interface 101 and adjacent chambers. The enclosure system 130 seals to the load port 128 responsive to being docked on the load port 128. The enclosure system 130 provides purge port access so that the interior of the enclosure system 130 can be purged prior to opening the enclosure system 130 to minimize disturbance of the inert environment within the factory interface 101.

Figure 2A:
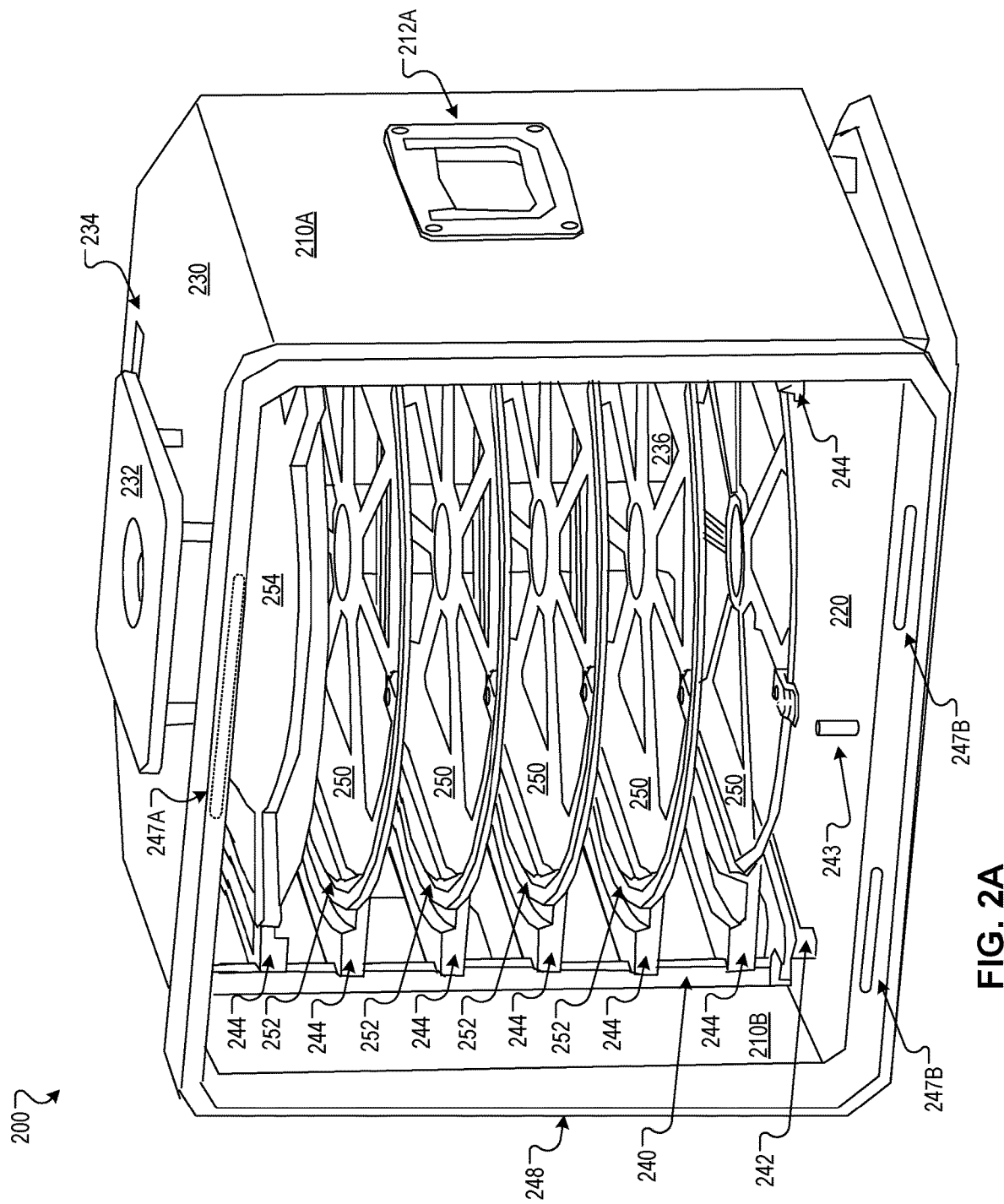
FIG. 2A illustrates a perspective view of an enclosure system, according to certain embodiments.

FIG. 2A illustrates a perspective view of an enclosure system 200 (e.g., enclosure system 130 of FIG. 1), according to certain embodiments.

Enclosure system 200 includes walls including sidewalls 210 (e.g., sidewalls 210A-B), one or more rear walls, and bottom wall 220. Enclosure system 200 includes an enclosure lid 230 (e.g., removable upper wall) coupled to (e.g., top surface mounted, side perimeter mounted) one or more of the walls (e.g., one or more sidewalls 210 and/or one or more rear walls) to at least partially enclose an interior volume of the enclosure system 200. In some embodiments, the enclosure lid 230 is configured to removably attach to one or more of the walls.

In some embodiments, the enclosure lid 230 is attached to an overhead transport component 232. In some embodiments, the enclosure system has one or more windows (e.g., observation windows). In some embodiments, enclosure lid 230 includes an upper window 234 (e.g., upper observation window). In some embodiments, at least one of the rear walls of the enclosure system includes a rear window 236 (e.g., rear observation window).

Posts 240 are coupled to the bottom wall 220 (e.g., via a base connector 242). Shelves 244 are disposed in the interior volume of the enclosure system 200. Each of the shelves 244 may be configured to support a corresponding object (e.g., content 110 of FIG. 1). In some embodiments, each shelf 244 is connected to at least one post 240.

In some embodiments a first set of posts 240 (e.g., a first pair of posts 240, two posts 240) are coupled to the bottom wall 220 (e.g., via the same base connector 242) proximate sidewall 210A and a second set of posts 240 (e.g., a second pair of posts 240, two additional posts 240) are coupled to the bottom wall 220 (e.g., via a different base connector 242) proximate sidewall 210B. A set of shelves 244 (e.g., a pair of shelves 244, two shelves 244, a first shelf 244 and a second shelf 244, coplanar shelves 244) may be used to support an object (e.g., content 110). The first shelf 244 may be attached to the first set of posts 240 and the second shelf 244 may be attached to the second set of posts 240. A first subset of the shelves 244 and a second subset of the shelves 244 may be oriented opposite each other in the interior volume (e.g., are in mirrored locations from each other).

The objects supported by shelves 244 may include a carrier 250, one or more process kit rings 252 disposed on a carrier 250, a placement validation wafer 254, a substrate, and/or the like.

In some embodiments, a placement validation wafer 254 (e.g., validation wafer) is an inspection wafer that includes sensors (e.g., imaging sensors, such as cameras) that provide sensor data to inspect an interior of a chamber of manufacturing equipment (e.g., a substrate processing chamber) and/or a component of manufacturing equipment.

Placement validation wafer 254 may include multiple imaging sensors to capture images of a lid of a chamber (e.g., processing chamber, EFEM, transfer chamber, load lock, FOUP, SSP, etc.), one or more sidewalls of a chamber, a bottom wall of a chamber, and/or a component of a chamber (e.g., process kit ring). Images from the multiple imaging sensors may be stitched together to generate a stitched image of the entire interior surface of the chamber. In some embodiments, the imaging sensors capture the visible spectrum of light. In some embodiments, the imaging sensors capture thermal radiation and/or visible light.

In some embodiments, placement validation wafer 254 includes one or more sensors (e.g., three sensors) to emit and receive a light beam to measure a distance the light beam has traveled. In some embodiments, placement validation wafer 254 includes a displacement sensor, an impedance sensor, and/or an acoustic sensor. Placement validation wafer 254 may include multiple sensors, including a pressure sensor, a temperatures sensor, a vibration sensor, an accelerometer, and/or a reflectometry sensor. In some embodiments, placement validation wafer 254 includes a piezo-resistive sensor and/or a piezoelectric acoustic sensor. In some embodiments, placement validation wafer 254 includes a no-contact sensor. The no-contact sensor may include a radar sensor that can scan a surface of a component of a processing chamber. Further, the no-contact sensor may include an x-ray emitter (e.g., an x-ray laser) and an x-ray detector. Additionally, placement validation wafer 254 may include an illumination component. The illumination component may at least partially illuminate an interior volume of a chamber.

In some embodiments, placement validation wafer 254 provides sensor data to determine whether a component of a processing chamber (e.g., a process kit ring) is in a predefined state (e.g., predefined orientation). For example, placement validation wafer 254 may provide sensor data to verify placement of a process kit ring in a processing chamber. Sensor data may include alignment data (e.g., of a process kit ring disposed in a processing chamber), image data (e.g., one or more captured images), light beam data (e.g., laser light beam data), vibration data, temperature data, humidity data, process gas data, particle data, pressure data, proximity data, displacement data, impedance data, acoustic data, placement data, etc. Sensor data may be associated with a condition of a process kit ring disposed in a processing chamber.

Placement validation wafer 254 may include a memory to store sensor data. Placement validation wafer 254 may include a power source (e.g., an electrical storage device, rechargeable battery). In some embodiments, placement validation wafer 254 includes one or more super-capacitors to store electrical energy used to power placement validation wafer 254. A super-capacitor may be a high-capacity capacitor with a capacitance value much higher than a conventional capacitor. In some embodiments, a super-capacitor stores 10 to 100 times more electrical energy per unit volume than an electrolytic capacitor. In some embodiments, a super-capacitor can be recharged. A super-capacitor may not contaminate a process chamber if dropped and broken inside the process chamber. In some embodiments, a super-capacitor can supply high electrical current for a short duration of time. Additionally, a super-capacitor may not pose a fire danger if dropped on a hot chuck of a processing chamber.

In some embodiments, a carrier 250 is configured to support one or more objects (e.g., process kit rings). In some embodiments, each carrier 250 has a carrier feature that is viewable via the upper window and/or a sensor of the enclosure system 200 or validation wafer 254 at the same time. In some embodiments, the carrier feature of each carrier 250, the feature on the upper surface of each process kit ring 252, and the flat portion of each process kit ring 252 are viewable at the same time via the upper window 234 and/or a sensor of the enclosure system 200 or validation wafer 254. Responsive to the flat portion of a process kit ring 252 not being in a correct location or the carrier feature not being in a correct location, a rear window of enclosure system 200 may be removed to adjust orientation of the process kit ring 252 and/or carrier 250. Responsive to the feature of the upper portion of a process kit ring 252 not being viewable via the upper window and/or a sensor of the enclosure system 200 or validation wafer 254 (e.g., not being in an upward orientation, being flipped over), the enclosure lid 230 and/or the enclosure door are removed to flip the process kit ring 252.

In some embodiments, a process kit ring 252 is a replaceable component of a processing chamber. A process kit ring 252 may be a ring configured to be disposed on a chuck (e.g., an electrostatic chuck) of a processing chamber. A process kit ring 252 may be a sacrificial part (e.g., a wear part) that degrades over time during plasma processes of the processing chamber. In some embodiments, a process kit ring disposed in a processing chamber is to be regularly replaced with a new process kit ring 252 disposed within enclosure system 200.

In some embodiments a carrier 250 is disposed on a first shelf 244 and a second shelf 244 and one or more process kit rings 252 are disposed on the carrier 250 without the process kit rings 252 contacting the shelves 244. Each shelf 244 may form a recess to guide the process kit ring 252 into the correct location on the carrier 250 responsive to the enclosure system 200 being moved (e.g., jostled, moved rapidly). In some embodiments, each shelf 244 includes an alignment feature to align a placement validation wafer 254 on the shelf 244. The alignment feature may not interfere with a carrier 250 or a process kit ring 252 responsive to a carrier holding a process kit ring being disposed on the shelf. In some embodiments, each shelf 244 is configured to support either a carrier 250 and a process kit ring 252, or a placement validation wafer 254.

In some embodiments, the upper window is configured for orientation verification (e.g., automated or manual orientation verification) of objects disposed in the interior volume. In some embodiments, the rear window 236 is removable for orientation adjustment (e.g., manual or automated orientation adjustment) of one or more of the objects.

In some embodiments, each of the process kit rings 252 has a corresponding flat portion (e.g., flat interior portion) that is viewable via the upper window 234. In some embodiments, each of the process kit rings 252 includes a feature (e.g., notch, perimeter notch, recess, marking, upper surface perimeter notch, etc.) on an upper surface (or lower surface) of the process kit ring 252 that is viewable via the upper window 234. In some embodiments, the feature is a corresponding upper surface perimeter notch. In some embodiments, the feature (e.g., perimeter notch) is a step on an upper surface of the process kit ring 252 proximate the inner diameter of the process kit ring (e.g., a step between the upper surface and an inner sidewall of the process kit ring). In some embodiments, the flat portion and/or feature (e.g., on an upper surface) of each of the process kit rings 252 are viewable via the upper window 234 at the same time (e.g., simultaneously). In some embodiments, each carrier 250 has a carrier feature that is viewable via the upper window 234 at the same time. In some embodiments, the carrier feature of each carrier 250, the feature on the upper surface of each process kit ring 252, and the flat portion of each process kit ring 252 are viewable at the same time via the upper window 234. Responsive to the flat portion of a process kit ring 252 not being in a correct location or the carrier feature not being in a correct location, the rear window 236 may be removed to adjust orientation of the process kit ring 252 and/or carrier 250. Responsive to the feature of the upper portion of a process kit ring 252 not being viewable via the upper window 234 (e.g., not being in an upward orientation, being flipped over), the enclosure lid 230 and/or the enclosure door are removed to flip the process kit ring 252.

A corresponding upper surface of each of the posts 240 may be configured to removably interface with a corresponding component of the enclosure lid 230. In some embodiments, the corresponding upper surface of each of the posts 240 forms a tapered recess configured to receive a tapered protrusion (e.g., fastener, etc.) coupled to the enclosure lid 230 to align each of the posts 240 with the enclosure lid 230.

Each of the shelves 244 may be configured to align objects (e.g., content 110 of FIG. 1), such as a carrier 250 and/or a process kit ring 252. In some embodiments, each shelf 244 has alignment features and/or surfaces that are configured to align objects on the shelf 244. In some embodiments, each of the shelves 244 may include a feature to align a placement validation wafer 254. If a robot arm places an object on shelf 244 in an incorrect position and/or transportation of the enclosure system 200 causes movement of the object, the alignment features and/or surfaces align the object into a correct position. In some embodiments, a shelf 244 has retaining devices configured to secure the object to the shelf 244.

In some embodiments, the interior volume of the enclosure system 200 is a mini environment (e.g., sealed environment). In some embodiments, the interior volume of the enclosure system 200 is kept substantially particle free (e.g., substantially uncontaminated). In some embodiments, the enclosure system 200 includes a fan (e.g., at the top surface) that suppresses any particles in the interior volume. In some embodiments, the interior volume is substantially devoid (or completely devoid) of one or more of moisture, oxygen, particles (e.g., dust), or the like. In some embodiments, enclosure system 200 includes multiple seals and/or multiple sealing surfaces. For example, handle 212A may be mounted to a bracket that forms a fully sealed interface between sidewall 210A and handle 212A. Additionally, in some embodiments, enclosure system 200 includes multiple sealed fasteners (e.g., fastener 274 of FIGS. 2D-2E) which seal portions of enclosure system 200 where fasteners pass through a wall (e.g., sidewalls 210, enclosure lid 230, bottom wall 220, etc.). In some embodiments, fasteners of enclosure system 200 are threaded into a bind nut. In some embodiments, fasteners of enclosure system 200 are threaded into a sealing nut (e.g., see FIGS. 2D-E).

One or more of the walls of the enclosure system 200 may form or may be coupled to a door interface portion 248 (e.g., front interface, bezel). In some embodiments, the door interface portion 248 forms one or more recesses 247. The door interface portion may form one or more recesses to interface with latches of a door. The door interface portion 248 (e.g., front interface) is configured to interface with (e.g., seal to) a door for transportation of the enclosure system 200 (e.g., and to provide a sealed environment). The door interface portion 248 (e.g., front interface) is configured to interface (e.g., seal to) a substantially vertical portion of a load port of a substrate processing system. Responsive to the door interface portion 248 (e.g., front interface) being sealed to a door or the load port, the enclosure system 200 creates a sealed environment (e.g., gases and/or particles do not leave or enter the enclosure system 200 from the surrounding environment outside of the substrate processing system).

In some embodiments, door interface portion 248 includes recesses 247 (e.g., latch grooves) to interface with latches of a door. Recesses 247 may be cutouts in an inner surface of door interface portion 248. In some embodiments, recesses 247 extend partially through a thickness of door interface portion 248 from an inner surface of door interface portion 248. In some embodiments, recess 247A is formed by an upper inner surface of door interface portion 248. In some embodiments, one or more recesses 247B are formed by a lower inner surface of door interface portion 248. In some embodiments, a door latch clamps onto a surface of the door interface portion 248 that forms one of the recesses 247 to clamp and/or seal the door against door interface portion 248 (e.g., see FIGS. 2B-C).

In some embodiments, the bottom wall 220 includes or is coupled to a baseplate (e.g., adaptor plate). The baseplate is configured to interface with a horizontal portion of the load port. The baseplate has features (e.g., recesses, receptacles, kinematic interface) to receive kinematic devices (e.g., kinematic pins, precision located pins) of the horizontal portion of the load port. In some embodiments the baseplate is secured to the bottom wall 220 prior to interfacing the enclosure system 200 with the load port. In some embodiments, the baseplate is secured to the load port and then the bottom wall 220 is secured to the baseplate. In some embodiments, the enclosure system 200 has a seal (e.g., crushable seal, gasket) to seal one or more openings in the bottom wall 220.

In some embodiments, an identification pin 243 (e.g., detection pin) extends from a wall of the enclosure system 200. In some embodiments, the identification pin 243 extends (e.g., into the interior volume formed by the enclosure system 200) from bottom wall 220 proximate a front opening of enclosure system 200. In some embodiments, identification pin 243 extends into the interior volume from enclosure lid 230. Identification pin 243 may be configured to be scanned by a robot (e.g., a factory interface robot). Identification pin 243 may be configured to break a light beam of a robot (e.g., factory interface robot 111 of FIG. 1) responsive to a portion (e.g., a portion of the end effector) of the robot extending through a front opening of the enclosure system 200. The light beam may be broken as a portion of the robot crosses the identification pin 243.

In some embodiments, a robot (e.g., factory interface robot 111 of FIG. 1) includes an end effector (e.g., to support and transport objects), wrist member (e.g., to rotate the end effector), etc. The end effector and/or the wrist member includes a beam sensor, which, in some embodiments, includes a light source and a light receiver. A light transmitting fiber is coupled to the light source. The light transmitting fiber is routed through the wrist member and the end effector and terminates at a first end of the end effector. A light receiving fiber is coupled to the light receiver. The light receiving fiber is routed through the wrist member and the end effector and terminates at a second end of the end effector. The first end and the second end of the end effector are spaced apart across a gap that forms a relief region for certain types of processing including detecting a peripheral edge of a substrate, other content, and/or an object (e.g., an identification pin 243).

The light transmitting fiber terminates at a first light path opening proximate the first end. Similarly, the light receiving fiber terminates at a second light path opening proximate the second end. The first light path opening and the second light path opening face each other and form a light transmission path (e.g., a light beam) for detecting the presence or absence of a peripheral edge of a substrate, other content, and/or an object (e.g., identification pin 243). The light transmission path extends between the first end and the second end (e.g., between two points), which enables detection of objects in the gap.

The beam sensor further includes a light transmitting/receiving module that detects degrees of light transmission between the light transmitting fiber and the light receiving fiber. The light transmitting/receiving module senses a peripheral edge of a substrate or other object (e.g., identification pin 243) located between the first light path opening and the second light path opening when the substrate or other object blocks the light transmission path. An output signal generated by the light transmitting/receiving module is provided to the controller (e.g., controller 109 of FIG. 1) via conductors (not shown) passing through the robot. In some embodiments, the robot can be used to detect a thickness of identification pin 243. The controller (e.g., controller 109 of FIG. 1) can control the robot to cause the light source to provide the light transmission (e.g., light beam) between the first end and the second end of the end effector. The controller can further cause the end effector to move at a predetermined velocity to break the light beam with the identification pin 243 (e.g., the identification pin is between the first and second ends of the end effector along the beam transmission path) and to continue at the predetermined velocity until the light beam is no longer broken (e.g., the identification pin 243 is between a portion of the end effector between the first and second ends of the end effector and the light transmission path). The controller may determine the amount of time from the breaking of the light beam until the light beam was no longer broken at the predetermined velocity. The controller may use the robot to determine a thickness of identification pin 243 by multiplying the velocity of the robot (e.g., end effector) as the portion crosses identification pin 243 by the amount of time from when the light beam is broken to when the light beam is no longer broken. In some embodiments, a difference in thickness of the identification pin 243 of approximately two millimeters is sufficient for the robot to detect a difference of identification pin thicknesses.

Each enclosure system 200 may have an identification pin 243 of a predetermined thickness to represent the type of enclosure system 200 or the type of content of the enclosure system 200. The thickness of the identification pin 243 may be used to determine what objects (e.g., carriers 250, process kit rings 252, placement validation wafers 254, etc.) an enclosure system 200 is configured to support. In some embodiments, the identification pin 243 may be used to determine that the enclosure system is configured to support objects. For example, an identification pin 243 having a first thickness may indicate that the enclosure system 200 is configured to support multiple process kit rings 252 disposed on carriers 250. In another example, an identification pin 243 having a second thickness may indicate that the enclosure system 200 is configured to support multiple empty carriers 250. In a further example, an identification pin 243 having a third thickness may indicate that the enclosure system 200 is configured to support a placement validation wafer 254.

In some embodiments, one or more of an overhead transport component 232 (e.g., overhead transport flange) or at least one handle 212 is coupled to one or more surfaces of the enclosure system 200 for transport (e.g., automated transport, manual transport, etc.) of the enclosure system 200. In some embodiments, the overhead transfer (OHT) component 232 is coupled (e.g., attached) to the enclosure lid 230. In some embodiments, handle 212A is disposed on a sidewall 210A and a second handle is disposed on sidewall 210B.

In some embodiments, one or more purge adaptors are disposed in the bottom wall 220 (e.g., inserted into openings formed in the bottom wall 220). The purge adaptors are used to one or more of fill the enclosure system 200 with a gas (e.g., Nitrogen ($N_2$)), remove gas from the enclosure system, pass a gas through the enclosure system 200, or the like. The purge adaptors extend through the baseplate to fluidly couple with one or more of a gas or vacuum line (e.g., for purging the enclosure system 200, for creating a vacuum in the enclosure system 200, for filling the enclosure system 200 with a gas, etc.). Each of the purge adaptors provides a seal at a corresponding opening in the bottom wall 220 (e.g., to provide a sealed environment). In some embodiments, the enclosure system 200 seals to the load port responsive to being docked to the load port. The interior volume of the enclosure system 200 is configured to be purged via the one or more purge adaptors prior to opening of the enclosure system 200.

FIGS. 2B-C illustrate a cross sectional side view of components of an enclosure system (e.g., of enclosure system 200) associated with securing a door, according to certain embodiments.

Referring to FIG. 2B, in some embodiments, door interface portion 248 forms recess 247A (e.g., latch groove) in an inner upper surface of door interface portion 248. Recess 247A may extend from an inner surface of door interface portion 248 partially through a thickness of door interface portion 248 without extending to the outer surface of the door interface portion 248 to prevent leakage of gas between the exterior of the enclosure structure and the interior volume of the enclosure structure. In conventional systems, latches may interface with openings (e.g., through-holes) that extends completely through an entire thickness of the door interface portion 248 (e.g., from the inner surface to the outer surface) which may allow leakage of gas and/or contaminants through the openings.

As shown in FIG. 2B, recess 247A may extend only partially through a thickness of door interface portion 248 which prevents or lessens air leakage and/or contamination of the enclosure system 200. In some embodiments, door interface portion 248 is coupled to enclosure lid 230 by a fastener 274 (e.g., multiple fasteners 274).

A door latch 249A may interface with a surface of door interface portion 248 that forms recess 247A as shown in FIG. 2B. In some embodiments, door latch 249A is actuated by a lever. Door 246 may seal against a surface of door interface portion 248 responsive to door latch 249A interfacing with recess 247A.

Referring to FIG. 2C, in some embodiments, door interface portion 248 forms recess 247B in an inner lower inner surface of door interface portion 248. Recess 247B may extend from a surface of door interface portion 248 partially through a thickness of door interface portion 248. In some embodiments, door interface portion 248 includes a boss 251 corresponding to recess 247B. Boss 251 may be a protrusion of an outer surface of door interface portion 248 to strengthen door interface portion 248 opposite recess 247B (e.g., and to provide enough material to form recess 247B). In some embodiments, boss 251 may be a fillet. In some embodiments, door interface portion 248 is coupled to bottom wall 220 by a fastener 274 (e.g., multiple fasteners 274).

A door latch 249B may interface with a surface of door interface portion 248 at the recess 247B as shown in FIG. 2C. In some embodiments, door latch 249B is actuated by a lever. Door latch 249B may be coupled by a linkage to door latch 249A. Door 246 may seal against a surface of door interface portion 248 responsive to door latch 249B interfacing with recess 247B.

FIGS. 2D-E illustrate cross sectional side views of components of enclosure systems (e.g., of enclosure system 200) associated with fasteners, according to certain embodiments.

Referring to FIG. 2D, in some embodiments, a wall (e.g., of enclosure system 200) includes a fastener 274, a nut 275, and/or a sealing nut 277. In some embodiments (e.g., as shown in FIG. 2D), fastener 274 is inserted through an opening formed by bottom wall 220. In some embodiments, fastener 274 is inserted through an opening formed by a sidewall 210, enclosure lid 230, and/or a rear wall of enclosure system 200. In some embodiments, fastener 274 is a threaded fastener. Nut 275 may be a threaded nut. In some embodiments, sealing nut 277 seals an opening of the surface through which fastener 274 is inserted (e.g., surface of bottom wall 220). Sealing nut 277 may include a boss (e.g., protrusion) that interfaces with a counter-bore (e.g., recess) of the opening formed by the wall. Sealing the opening formed by the wall prevents and/or lessens leakage of gas and/or particles between outside of the enclosure structure 200 and an interior volume of the enclosure structure 200 (e.g., that may contaminate an inner volume of the enclosure system 200).

Referring to FIG. 2E, in some embodiments, enclosure system (e.g., enclosure system 200) includes a fastener 274 and a blind nut 276. Blind nut 276 may be a threaded nut into which fastener 274 can be threaded. In some embodiments, blind nut 276 includes a sealing surface configured to abut an interior surface of bottom wall 220. Blind nut 276 may seal the opening through which fastener 274 is inserted.

FIG. 3A illustrates a top view of an enclosure system 300, according to certain embodiments. FIG. 3B illustrates a rear perspective view of an enclosure system 300, according to certain embodiments. In some embodiments, features that have reference numbers that are similar to reference numbers in other figures include similar features and/or functionality as those described in other figures. In some examples, enclosure system 300 has similar features and/or functionality as enclosure system 130 of FIG. 1 and/or enclosure system 200 of FIG. 2.

An enclosure lid 330 (e.g., enclosure lid 230 of FIG. 2) includes an upper window 334 (e.g., upper window 234 of FIG. 2). Objects disposed in the interior volume of the enclosure system 300 may be viewable via the upper window 334. In some embodiments, each of the process kit rings 352 (e.g., process kit rings 252 of FIG. 2) are viewable via the upper window 334. In some embodiments, each of the process kit rings 352 are viewable from a tilted (e.g., angled) viewpoint (e.g., not 90 degrees up the upper window 334). Each of the process kit rings 352 may include one or more features that are to be viewable via the upper window 334. In some examples, a flat surface 360 and/or an upper surface feature (e.g., notch, marking, recess, etc.) of each of the process kit rings 352 are to be viewable via the upper window 334. In some embodiments, flat surface 360 forms a corresponding flat interior portion of process kit ring 352. Responsive to the flat surface 360 not being in a correct location in the view via the upper window 334, the orientation of the process kit ring 352 is to be adjusted (e.g., rotated to be located in the correct location). Responsive to the upper surface feature not being viewable via the upper window 334, the process kit ring 352 is to be flipped over (e.g., the upper surface feature is currently oriented downward and the process kit ring 352 is to be flipped to have the upper surface feature oriented upward).

Referring to FIG. 3B, enclosure system 300 has one or more rear walls 314. In some examples, a rear wall 314A is coupled to (e.g., integral with, angled off from) a sidewall (e.g., sidewall 210A of FIG. 2) that has a handle 312A (e.g., handle 212A of FIG. 2) and rear wall 314B is coupled to (e.g., integral with, angled off from) a sidewall (e.g., sidewall 210B of FIG. 2) that has a handle 312B (e.g., handle 212A of FIG. 2). A rear wall 314C (e.g., central rear wall) may be disposed between rear wall 314A and rear wall 314B. Rear wall 314C may include a rear window 336 that is removable to adjust orientation of one or more of the process kit rings 352 and/or one or more of the carriers 350. In some embodiments, rear wall 314A has a rear window 336 (e.g., that is fixed or removable) and/or rear wall 314B has a rear window 336 (e.g., that is fixed or removable). An RFID holder 370 may be removably coupled to a lower portion of rear wall 314C.

Figure 3C:
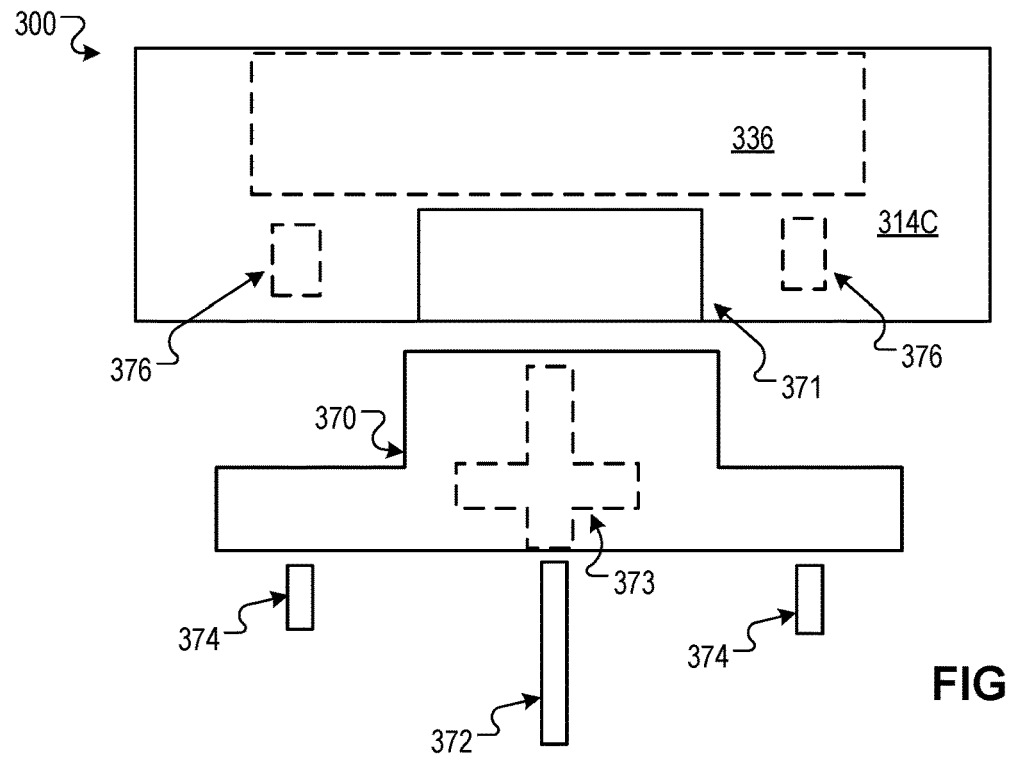
FIG. 3C illustrates a rear exploded view of components of an enclosure system, according to certain embodiments.
Figure 3D:
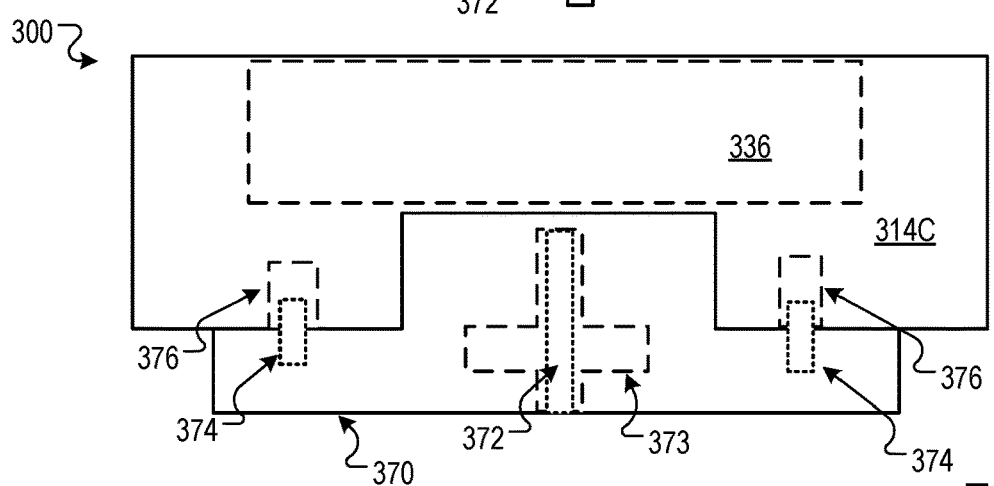
FIG. 3D illustrates a rear view of components of an enclosure system, according to certain embodiments.
Figure 3E:
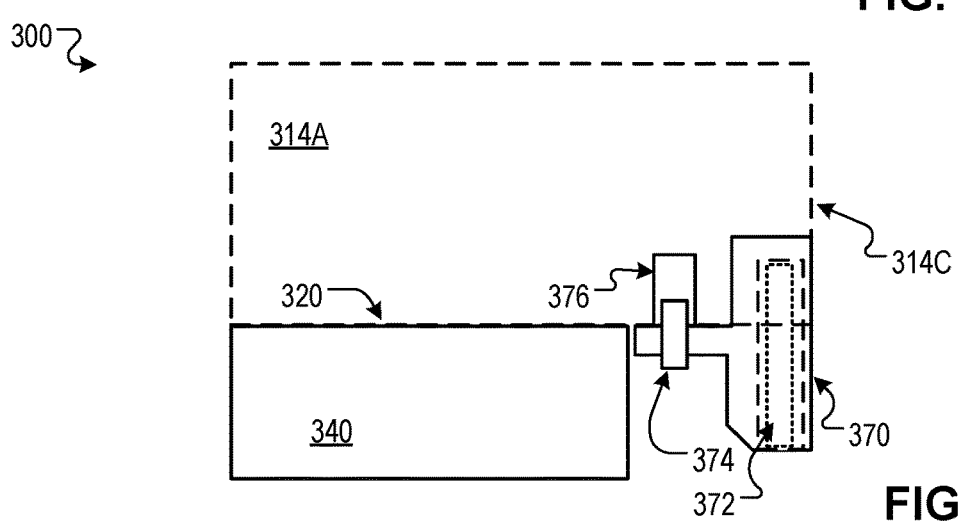
FIG. 3E illustrates a side view of components of an enclosure system, according to certain embodiments.

FIGS. 3C-E illustrates components of an enclosure system 300 (e.g., enclosure system 130 of FIG. 1, enclosure system of FIGS. 2A-E, etc.) associated with RFID holder 370, according to certain embodiments. FIG. 3C illustrates a rear exploded view of components of an enclosure system 300, according to certain embodiments. FIG. 3D illustrates a rear view of components of an enclosure system 300, according to certain embodiments. FIG. 3E illustrates a side view of components of an enclosure system 300, according to certain embodiments.

In some embodiments, enclosure system 300 includes an RFID component 372 (e.g., RFID pill, RFID tag, etc.). RFID component 372 may store and/or broadcast electronic information regarding enclosure system 300 (e.g., an inventory of enclosure system 300, type of objects enclosure system 300 is configured to support, etc.) to be read by an RFID reader (e.g., of a load port, etc.). In some embodiments, RFID component 372 is secured by (e.g., held in) an RFID holder 370. RFID holder 370 may be configured secure RFID component 372 in a vertical orientation and/or in a horizontal orientation. RFID component 372 may be secured in an RFID component pocket 373 formed by RFID holder 370. RFID component pocket 373 may be an inner cavity formed by RFID holder 370.

In some embodiments, RFID holder 370 may removably couple to rear wall 314C at an opening (e.g., opening 371) formed by rear wall 314C. Opening 371 may be a cutout of rear wall 314C to minimize interference of rear wall 314C with a signal broadcast by RFID component 372. While coupled to rear wall 314C at opening 371, RFID holder 370 may seal the rear wall 314C at opening 371 from leakage of gas and/or contaminants between inner volume of enclosure system 300 and outside of the enclosure system 300. In some embodiments, a gasket is fixed between RFID holder 370 and a border of rear wall 314C that forms opening 371 to seal the area between the RFID holder 370 and rear wall 314C at opening 371. In some embodiments, RFID holder 370 may be removably coupled to bottom wall 320 by a fastener 374 and a corresponding blind nut 376. In some embodiments, RFID holder 370 may be removably coupled by two fasteners 374 and two corresponding blind nuts 376. In some embodiments, fastener 374 is a non-metal fastener. In some embodiments, fastener 374 is a threaded nylon fastener. Fastener 374 may be of a material that does not interfere with a signal broadcast by RFID component 372. In some embodiments, RFID holder 370 is coupled to bottom wall 320 behind a base plate 340 of enclosure system 300.

In some embodiments, RFID holder 370 and the opening formed by walls of enclosure system 300 cause the weight of the enclosure system 300 to be substantially balanced (e.g., the RFID holder 370 is configured to act as a counterweight) responsive to enclosure system 300 being coupled to a transport apparatus (e.g., robot) via an overhead transport component (e.g., overhead transport component 232 of FIG. 2A). In some embodiments, RFID holder 370 is configured to balance the enclosure system 300 in an approximately vertical orientation while the enclosure system 300 is transported by an overhead transport apparatus. RFID holder 370 may balance enclosure system 300 within approximately +/−1 to 10 mm, 1 to 5 mm, or 1 mm off-center while the enclosure system 300 is coupled to the transport apparatus via the overhead transport component.

Figure 4A:
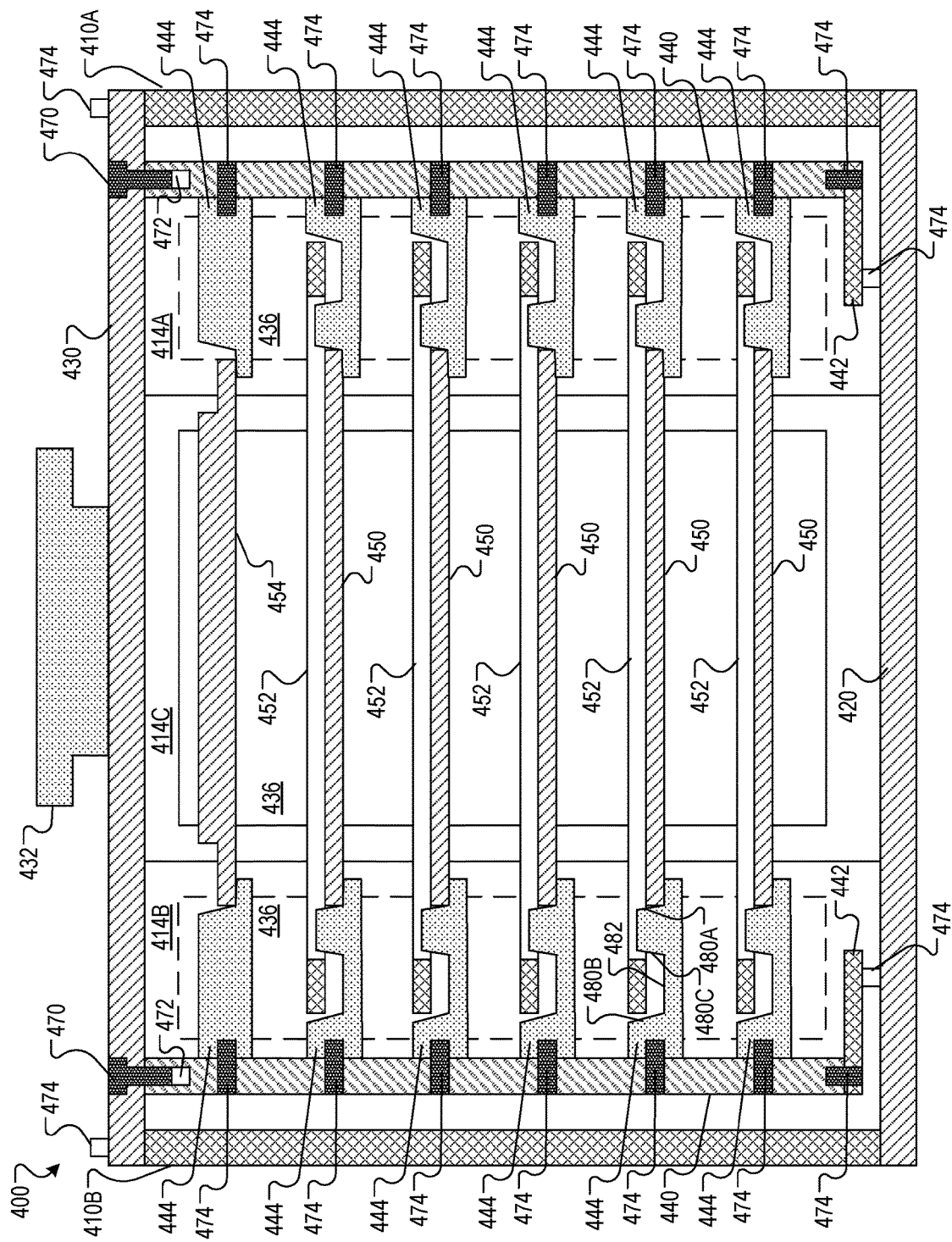
FIG. 4A illustrates a cross-sectional front view of an enclosure system, according to certain embodiments.
Figure 4B:
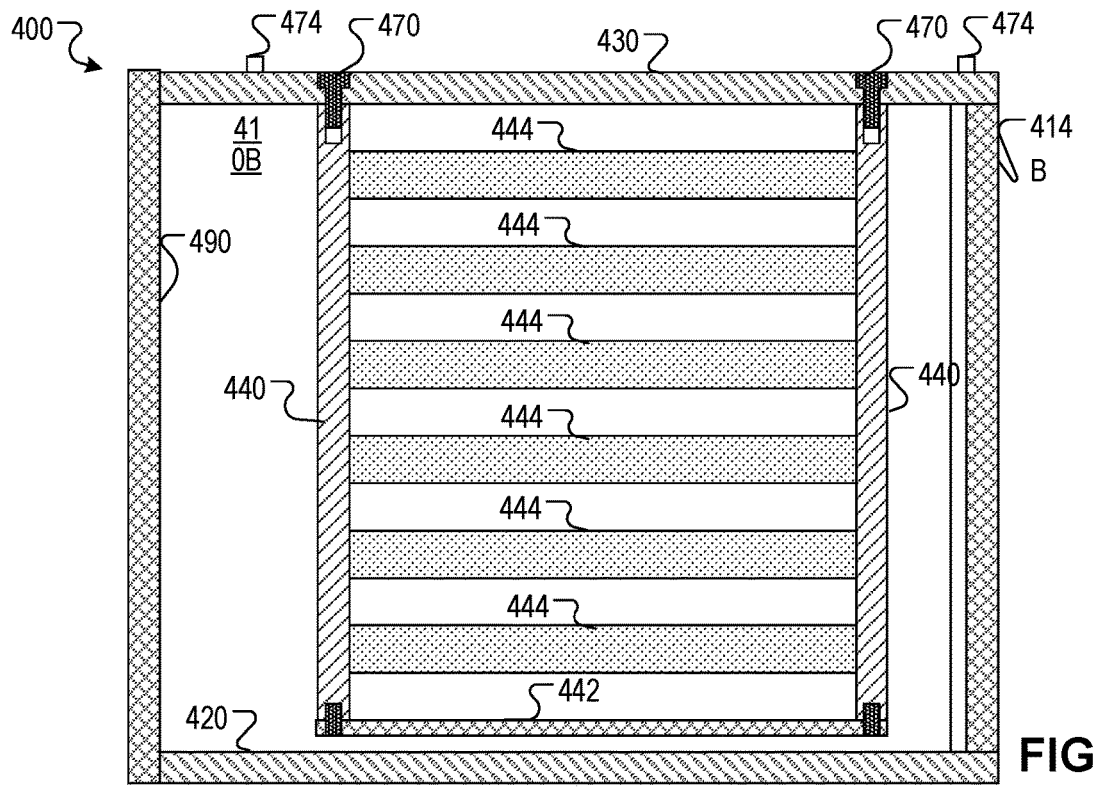
FIG. 4B illustrates a cross-sectional side view of an enclosure system, according to certain embodiments.
Figure 4C:
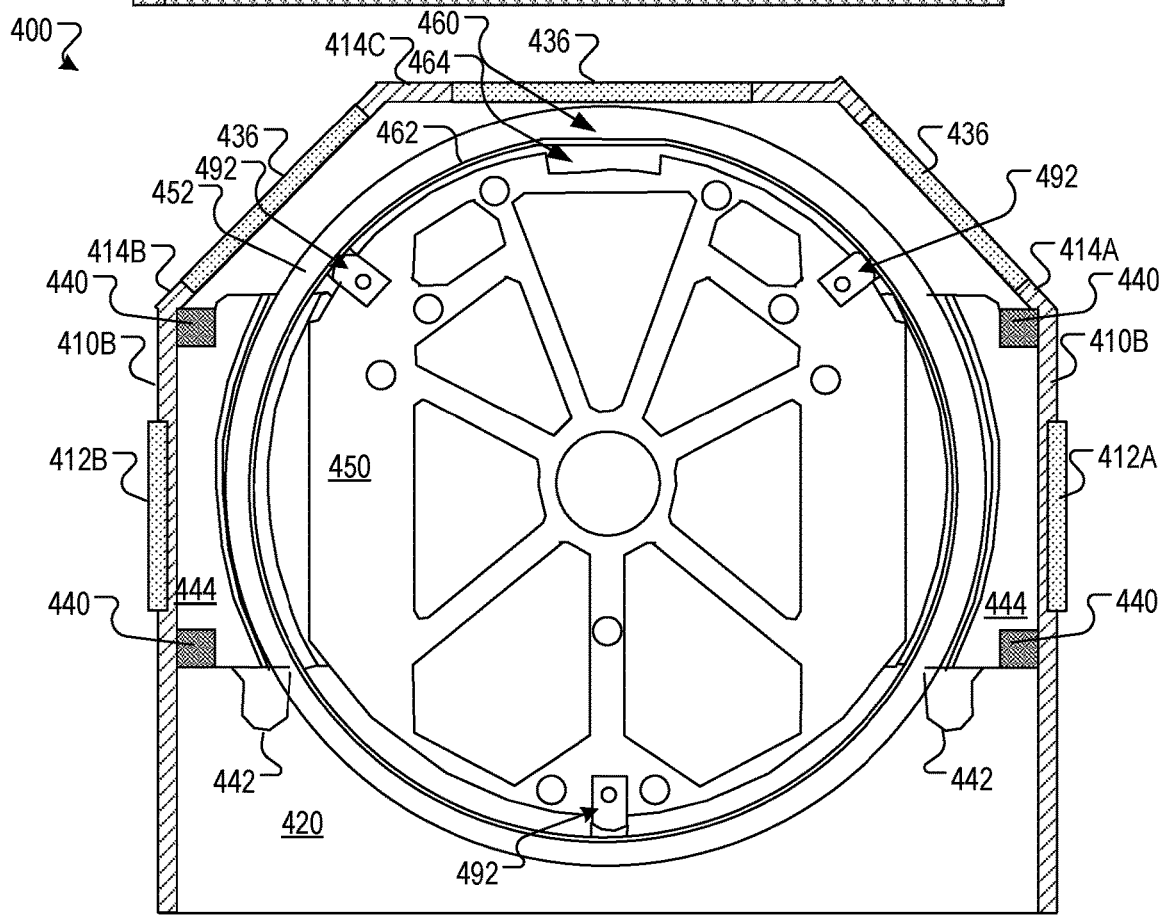
FIG. 4C illustrates a cross-sectional upper view of an enclosure system, according to certain embodiments.

FIG. 4A illustrates a cross-sectional front view of an enclosure system 400, according to certain embodiments. FIG. 4B illustrates a cross-sectional side view of an enclosure system 400, according to certain embodiments. FIG. 4C illustrates a cross-sectional upper view of an enclosure system 400, according to certain embodiments. In some embodiments, features that have reference numbers that are similar to reference numbers in other figures include similar features and/or functionality as those described in other figures. In some examples, enclosure system 400 has similar features and/or functionality as enclosure system 130 of FIG. 1, enclosure system 200 of FIG. 2, and/or enclosure system 300 of FIGS. 3A-B.

Enclosure system 400 includes walls that include one or more of sidewalls 410A-B (e.g., sidewalls 210A-B of FIG.

2), rear walls 414A-C (e.g., rear walls 314A-C of FIG. 3B), bottom wall 420 (e.g., bottom wall 220 of FIG. 2). An enclosure lid 430 (e.g., enclosure lid 230 of FIG. 1) is configured to couple to one or more of the walls of enclosure system 400 (e.g., via one or more fasteners 474 (e.g., button head screws). The enclosure lid 430 includes an upper window (e.g., upper window 234 of FIG. 2, etc.). One or more of the rear walls 414 includes a rear window 436 (e.g., rear window 236 of FIG. 2, etc.). One or more of the rear windows 436 are removable to adjust orientation of one or more of the carriers 450, process kit rings 452, and/or placement validation wafer 454. An overhead transportation component 432 may be coupled to the enclosure lid 430.

Posts 440 (e.g., posts 240 of FIG. 2) are coupled to the bottom wall 420 (e.g., via base connector 442 and one or more fasteners 474). The posts 440 removably interface with enclosure lid 430. In some embodiments, an upper surface of each post 440 forms a recess 472 and a component 470 (e.g., fastener 474, protrusion, pilot pin, etc.) of the enclosure lid 430 interfaces with the recess 472 (e.g., sleeve, plastic sleeve, nylon sleeve, etc.). In some embodiments, the recess 472 is tapered recess and the component 470 is a tapered protrusion to align the enclosure lid 430 with the posts 440. Shelves 444 are coupled (e.g., via fasteners 474) to the posts 440. A carrier 450 is disposed on two shelves 444 (e.g., a pair of shelves 444). A placement validation wafer 454 is disposed on two shelves (e.g., a pair of shelves 444). One or more process kit rings are disposed on a carrier 450 (e.g., without the one or more process kit rings 452 contacting a shelf 444).

In some embodiments, a shelf 444 includes a sloped surface 480A to align the carrier 450 on the shelf 444. In some embodiments, a shelf 444 includes a recess 482 (e.g., pocket of deep pocket shelves 444) formed by sloped surfaces 480B-C to align the process kit ring 452 on the carrier 450 responsive to movement of the enclosure system 400 (e.g., jostling, rapid movement, etc.). In some embodiments, a shelf 444 includes an alignment feature (e.g., alignment feature 445, see FIGS. 4D-E) to align a placement validation wafer 454 on the shelf 444. The alignment feature may not interfere with a process kit ring 452 on a carrier 450 disposed on the shelf. The alignment feature may allow the shelf 444 to support either a placement validation wafer 454 or a carrier 450 holding a process kit ring 452. In some embodiments, the shelves form the alignment features.

Referring to FIG. 4B, each shelf 444 may be coupled (e.g., fastened, attached, etc.) to two posts 440. The two posts 440 are coupled to the bottom wall 420 via the same base connector 442. In some embodiments, an enclosure door 490 is configured to removably couple (e.g., attach, clamp, seal, etc.) to one or more of the walls and/or enclosure lid 430 of the enclosure system 400.

Referring to FIG. 4C, process kit ring 452 has a flat surface 460 (e.g., flat surface 360 of FIG. 3A, flat inside surface, etc.) and/or an upper surface feature 462 (e.g., notch, marking, recess, etc.) of each of the process kit rings 452 that are to be viewable via the upper window. In some embodiments, process kit rings 452 include a corresponding feature (e.g., upper surface perimeter notch, a step on an upper surface of the process kit ring 252 proximate the inner diameter of the process kit ring, a step between the upper surface and an inner sidewall of the process kit ring). Responsive to the flat surface 460 not being in a correct location in the view via the upper window 334, the orientation of the process kit ring 452 is to be adjusted (e.g., rotated to be located in the correct location). Responsive to the upper surface feature 462 not being viewable, the process kit ring 452 is to be flipped (e.g., so that the upper surface feature 462 is oriented upwards instead of downward). In some embodiments, the carrier has a carrier feature 464 (e.g., recess, cut-out) that is disposed proximate the flat surface 460 of the process kit ring 452. The carrier feature 464 is viewable via the upper window of the enclosure lid to determine whether the carrier 450 is oriented correctly. In some embodiments, the carrier 450 includes fingers 492 that support the process kit ring 452.

Figure 4D:
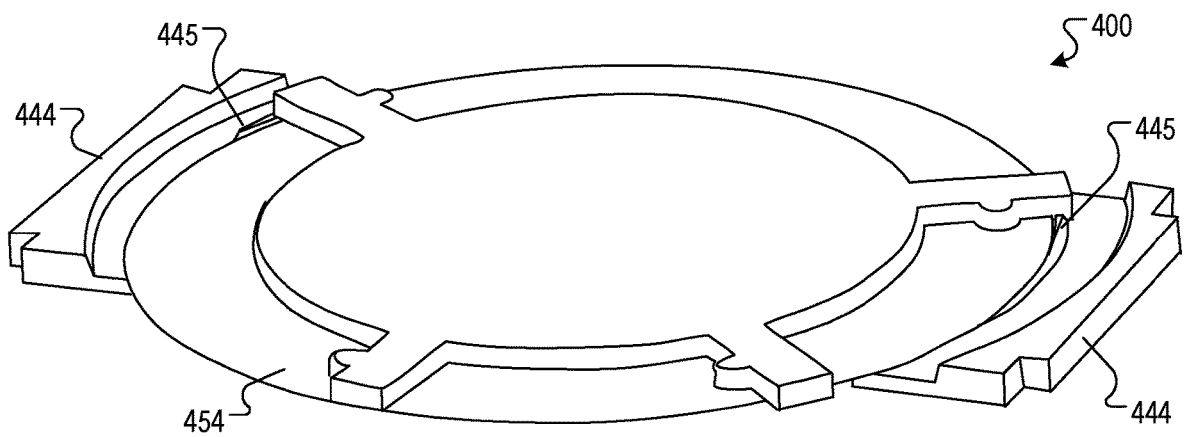
FIGS. 4D-E illustrate a perspective view of components of enclosure systems, according to certain embodiments.
Figure 4E:
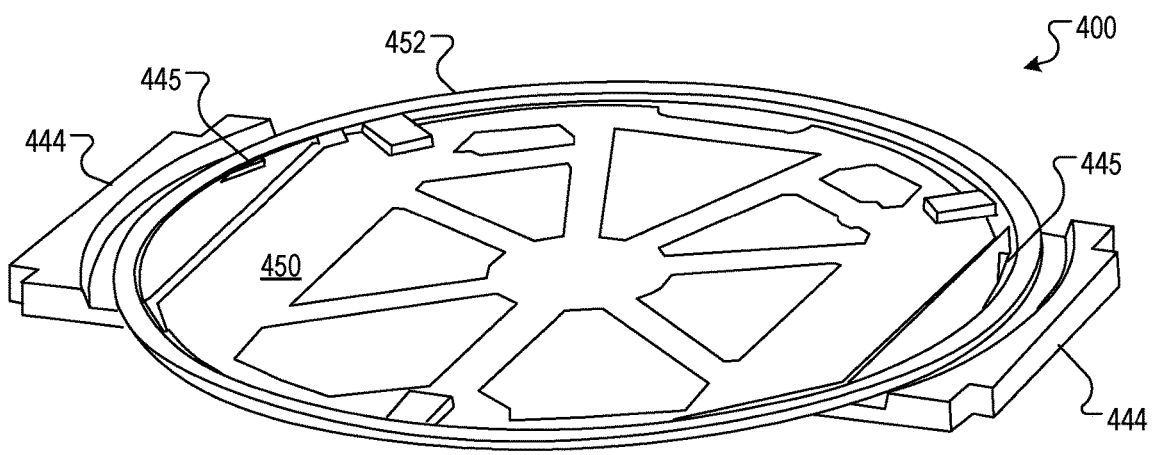

FIGS. 4D-E illustrate a perspective view of components of enclosure systems 400 (e.g., enclosure system 130 of FIG. 1, enclosure system 200 of FIGS. 2A-E, enclosure system 300 of FIGS. 3A-E, etc.), according to certain embodiments.

In some embodiments, a pair of shelves 444 is configured to support a placement validation wafer 454 responsive to a placement validation wafer 454 being disposed on the pair of shelves 444 and is configured to support a carrier 450 supporting a process kit ring 452 responsive to the carrier 450 supporting the process kit ring 452 being disposed on the one or more shelves 444.

In some embodiments, the pair of shelves 444 include alignment features 445 to align a placement validation wafer 454 on the shelves 444. The alignment feature may not interfere with a process kit ring 452 and/or a carrier 450 responsive to process kit ring 452 and/or carrier being disposed on the shelves 444 (as shown in FIG. 4E). In some embodiments, alignment feature 445 is a wedge-like feature on a top surface of shelves 444 adjacent to sloped surface 480C. Alignment feature 445 may align placement validation wafer 454 on shelf 444 by retaining an edge of placement validation wafer in a lateral position (e.g., a side-to-side position, see FIG. 4D). In some embodiments, alignment feature 445 is to align the placement validation wafer 454 in a predetermined position and is to retain the placement validation wafer 454 in the predetermined position during movement of the enclosure system 400 (e.g., during jostling, rapid movement, etc.) Referring to FIG. 4E, alignment feature 445 may be disposed inside an inner radius of process kit ring 452. Alignment feature 445 may not interfere with process kit ring 452 and/or carrier 450.

Figure 5:
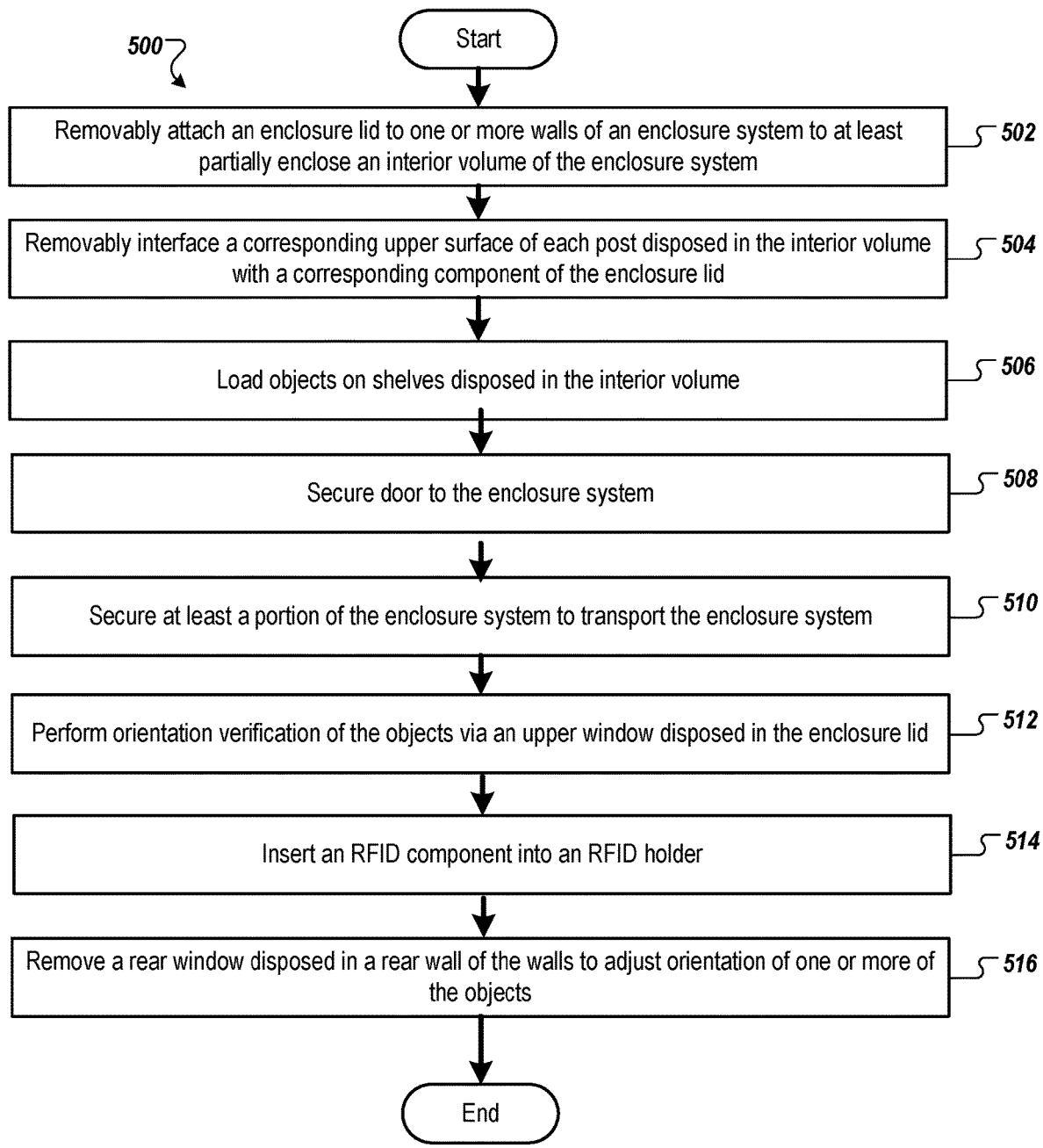
FIG. 5 illustrates a method of using an enclosure system, according to certain embodiments.

FIG. 5 illustrates a method 500 of using an enclosure system, according to certain embodiments. In some embodiments, one or more of operations of method 500 are performed by a robot arm (e.g., robot arm of factory interface robot 111 of FIG. 1, overhead transport robot, and/or by a controller (e.g., controller 109 of FIG. 1). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are included in every embodiment.

Referring to method 500 of FIG. 5, at block 502, an enclosure lid is removably attached (e.g., via fasteners, via clamps, etc.) to one or more walls (e.g., one or more sidewalls and/or one or more rear walls) of an enclosure system to at least partially enclose an interior volume of the enclosure system.

At block 504, a corresponding upper surface of each post disposed in the interior volume with a corresponding component of the enclosure lid. In some embodiments, the posts are coupled to the bottom wall of the enclosure system (e.g., via base connectors and/or fasteners). The upper surface of each post may form a recess and the corresponding component of the enclosure lid may be a protrusion that interfaces with the recess. In some embodiments, the recess of the post is a tapered recess and/or the corresponding component of the enclosure lid is a tapered protrusion. The tapered recess and/or tapered protrusion are configured to align the posts with the enclosure lid.

At block 506, objects are loaded on shelves disposed in the interior volume. In some embodiments, a carrier supporting one or more process kit rings is loaded onto two coplanar shelves. Responsive to the carrier being placed on the two shelves, the one or more process kit rings supported by the carrier may not contact the two shelves. In some embodiments, a placement validation wafer is loaded onto two substantially coplanar shelves.

At block 508, a door is secured to the enclosure system. In some embodiments, block 508 includes actuating laches of the door to interface the latches with recesses formed in a door interface portion of the enclosure system.

At block 510, at least a portion (e.g., overhead transport component, handles, etc.) of the enclosure system is secured to transport the enclosure system. In some embodiments, an overhead transport (OHT) vehicle lifts the enclosure system via the overhead transport component. An RFID holder may be configured to act as a counterweight of the enclosure system to balance the enclosure system while supported by the OHT vehicle.

At block 512, orientation verification of the objects is performed via an upper window disposed in the enclosure lid. The orientation verification may be performed by determining whether the flat portion of the process kit rings and the carrier feature (e.g., notch) of the carrier are correctly aligned in the upper window. The orientation verification may further be performed by determining whether an upper surface feature of the process kit ring is viewable via the upper window (e.g., verify the process kit ring is not flipped).

At block 514, an RFID component is inserted into an RFID holder. The RFID holder may be coupled to a rear wall of the enclosure system. In some embodiments, the RFID component can be inserted into the RFID holder in either a horizontal orientation or a vertical orientation. An RFID reader (e.g., of a load port) may read the RFID component responsive to inserting the RFID component into the RFID holder.

At block 516, a rear window disposed in a rear wall of the walls is removed to adjust orientation of (e.g., rotate) one or more of the objects. In some embodiments, block 512 is responsive to determining errors in orientation via the upper window.

In some embodiments, each of the operations of method 500 are performed while maintaining a sealed environment in the factory interface.

Unless specifically stated otherwise, terms such as "attaching," "loading," "removing," "interfacing," "securing," "transporting," "moving," "lowering," "causing," "removing," "placing," "disposing," "actuating," "locating," "closing," "locking," "aligning," "inserting," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and do not have an ordinal meaning according to their numerical designation.

Examples described herein also relate to an apparatus for performing the methods described herein. In some embodiments, this apparatus is specially constructed for performing the methods described herein, or it includes a general purpose computer system selectively programmed by a computer program stored in the computer system. In some embodiments, such a computer program is stored in a computer-readable tangible storage medium.

The methods and illustrative examples described herein are not inherently related to any particular computer or other apparatus. Various general purpose systems can be used in accordance with the teachings described herein, or a more specialized apparatus can be constructed to perform methods described herein and/or each of their individual functions, routines, subroutines, or operations. Examples of the structure for a variety of these systems are set forth in the description above.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations are performed in an inverse order so that certain operations are performed, at least in part, concurrently with other operations. In another embodiment, instructions or sub-operations of distinct operations are in an intermittent and/or alternating manner.

The terms "over," "under," "between," "disposed on," and "on" as used herein refer to a relative position of one material layer or component with respect to other layers or components. For example, one layer disposed on, over, or under another layer may be directly in contact with the other layer or may have one or more intervening layers. Moreover, one layer disposed between two layers may be directly in contact with the two layers or may have one or more intervening layers. Similarly, unless explicitly stated otherwise, one feature disposed between two features may be in direct contact with the adjacent features or may have one or more intervening layers.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. An enclosure system comprising:
    a plurality of walls comprising a plurality of sidewalls and a bottom wall;
    an enclosure lid configured to removably attach to one or more of the plurality of sidewalls, wherein the plurality of walls and the enclosure lid at least partially enclose an interior volume of the enclosure system;
    an upper window disposed in the enclosure lid, wherein the upper window is configured for orientation verification of a plurality of objects disposed in the interior volume;
    a radio-frequency identification (RFID) holder coupled to a rear wall of the plurality of sidewalls and configured to seal an opening formed in the rear wall, wherein the RFID holder is configured to secure an RFID component; and
    a plurality of shelves disposed in the interior volume, wherein each of the plurality of shelves is configured to support a corresponding object of the plurality of objects.

2. The enclosure system of claim 1, wherein a first subset of the plurality of shelves and a second subset of the plurality of shelves are oriented opposite each other in the interior volume.

3. The enclosure system of claim 1, further comprising a rear window disposed in the rear wall, wherein the rear window is removable for orientation adjustment of one or more of the plurality of objects.

4. The enclosure system of claim 1, further comprising:
    an overhead transport component coupled to a top surface of the enclosure lid, the overhead transport component configured to be secured to transport the enclosure system, wherein the RFID holder is configured to act as a counterweight to balance the enclosure system to maintain an approximately vertical orientation of the enclosure system during transport of the enclosure system.

5. The enclosure system of claim 1, further comprising:
    an identification pin extending from the bottom wall into the interior volume, wherein the identification pin is configured to be scanned by a factory interface robot to determine one or more types of the plurality of objects disposed in the interior volume.

6. The enclosure system of claim 1, further comprising:
    a door interface portion that forms a front opening for transferring one or more of the plurality of objects between the interior volume and an equipment front end module (EFEM), and wherein the door interface portion forms recesses to interface with latches of a door.

7. The enclosure system of claim 2, wherein:
    the plurality of objects comprises a carrier that is configured to support one or more objects of the plurality of objects;
    the carrier is disposed on a first shelf of the first subset of the plurality of shelves and a second shelf of the second subset of the plurality of shelves; and
    the carrier disposed on the first shelf and the second shelf is configured to support one or more process kit rings without the one or more process kit rings contacting the first shelf and without the one or more process kit rings contacting the second shelf.

8. The enclosure system of claim 1, wherein the plurality of objects comprises a plurality of process kit rings supported by a plurality of carriers disposed on the plurality of shelves, wherein each of the process kit rings comprises a corresponding flat interior portion that is viewable via the upper window for the orientation verification of the plurality of process kit rings.

9. The enclosure system of claim 1, wherein the plurality of objects comprises a plurality of process kit rings supported by a plurality of carriers disposed on the plurality of shelves, wherein each of the process kit rings comprises a corresponding feature that is viewable via the upper window to verify a corresponding upper surface of each of the process kit rings is oriented upwards.

10. The enclosure system of claim 1, wherein one or more shelves of the plurality of shelves form a plurality of alignment features configured to align a validation wafer responsive to the validation wafer being disposed on the one or more shelves, and wherein the one or more shelves are configured to support a carrier and a process kit ring responsive to the carrier and the process kit ring being disposed on the one or more shelves.

11. An enclosure system comprising:
    a plurality of walls comprising a plurality of sidewalls and a bottom wall;
    an enclosure lid configured to removably attach to one or more of the plurality of sidewalls, wherein the plurality of walls and the enclosure lid at least partially enclose an interior volume of the enclosure system;
    a plurality of posts disposed in the interior volume of the enclosure system, the plurality of posts being secured to the bottom wall of the enclosure system, wherein each post of the plurality of posts forms a corresponding recess to removably interface with a corresponding component of the enclosure lid; and
    a plurality of shelves, wherein each of the plurality of shelves is configured to support a corresponding object of a plurality of objects, wherein each of the plurality of shelves is secured to at least one corresponding post of the plurality of posts.

12. The enclosure system of claim 11, wherein a corresponding upper surface of each of the plurality of posts forms a tapered recess configured to receive a tapered protrusion coupled to the enclosure lid to align each of the plurality of posts with the enclosure lid.

13. The enclosure system of claim 11, wherein a first subset of the plurality of shelves are secured to a first subset of the plurality of posts, and wherein a second subset of the plurality of shelves are secured to a second subset of the plurality of posts.

14. The enclosure system of claim 13, wherein the plurality of objects comprises a carrier that is configured to support one or more objects of the plurality of objects, wherein the carrier is disposed on a first shelf of the first subset of the plurality of shelves and a second shelf of the second subset of the plurality of shelves.

15. The enclosure system of claim 13, wherein the plurality of objects comprises a validation wafer disposed on a first shelf of the first subset of the plurality of shelves and a second shelf of the second subset of the plurality of shelves.

16. The enclosure system of claim 11, further comprising:
    an overhead transport component coupled to an upper surface of the enclosure lid, wherein the overhead transport component is configured to be secured to transport the enclosure system; and
    a radio-frequency identification (RFID) holder coupled to a rear wall of the plurality of sidewalls, wherein the RFID holder is configured to secure an RFID component, wherein the RFID holder is configured to act as a counterweight to balance the enclosure system to maintain an approximately vertical orientation of the enclosure system during transport of the enclosure system.

17. A method comprising:
removably attaching an enclosure lid to one or more of a plurality of walls of an enclosure system;
loading a plurality of objects on a plurality of shelves disposed in an interior volume formed by the enclosure system, wherein an upper window disposed in the enclosure lid is configured for orientation verification of the plurality of objects; and
inserting a radio-frequency identification (RFID) component into an RFID holder coupled to a rear wall of the plurality of walls and configured to seal an opening formed in the rear wall.

18. The method of claim 17, wherein the loading of the plurality of objects on the plurality of shelves comprises loading a validation wafer onto one or more shelves of the plurality of shelves, wherein a plurality of alignment features of the one or more shelves are configured to align the validation wafer on the one or more shelves.

19. The method of claim 17 further comprising actuating latches of a door to interface the latches with recesses formed in a door interface portion of the enclosure system.

20. The method of claim 17 further comprising removably interfacing a corresponding upper surface of each of a plurality of posts disposed in the interior volume with a corresponding component of the enclosure lid, wherein each of the plurality of shelves is secured to at least one of the plurality of posts.

* * * * *